(12) United States Patent
Heidari et al.

(10) Patent No.: US 7,522,898 B2
(45) Date of Patent: Apr. 21, 2009

(54) HIGH FREQUENCY SYNTHESIZER CIRCUITS AND METHODS

(75) Inventors: Mohammad E Heidari, Los Angeles, CA (US); Ahmad Mirzaei, Los Angeles, CA (US); Masoud Djafari, Marina Del Ray, CA (US); Mike Choi, Los Angeles, CA (US); Filipp A Baron, Los Angeles, CA (US); Alireza Mehrnia, Los Angeles, CA (US); Rahim Bagheri, Los Angeles, CA (US)

(73) Assignee: WiLinx Corporation, Carlsbad, CA (US)

( * ) Notice: Subject to any disclaimer, the term of this patent is extended or adjusted under 35 U.S.C. 154(b) by 540 days.

(21) Appl. No.: 11/142,690

(22) Filed: Jun. 1, 2005

(65) Prior Publication Data

US 2007/0026816 A1 Feb. 1, 2007

(51) Int. Cl.
*H04B 7/00* (2006.01)

(52) U.S. Cl. .................... 455/255; 455/260; 455/183.1; 375/362; 375/372

(58) Field of Classification Search ................. 455/260, 455/323, 243, 76, 258, 118, 553.1, 150.1, 455/319, 165.1, 180.3, 186.1, 182.1, 209, 455/225, 182.2, 183.1, 189.1, 255; 375/308, 375/376, 362, 372, 377, 375, 294, 327; 327/156, 327/147, 157, 117; 331/34, 51; 329/325, 329/360 KT; 342/103
See application file for complete search history.

(56) References Cited

U.S. PATENT DOCUMENTS

| | | | | |
|---|---|---|---|---|
| 4,725,786 | A * | 2/1988 | Papaieck | 327/105 |
| 5,353,311 | A | 10/1994 | Hirata et al. | |
| 6,005,419 | A * | 12/1999 | Rudish | 327/107 |
| 6,188,285 | B1 * | 2/2001 | Nakanishi et al. | 331/2 |
| 6,405,024 | B1 | 6/2002 | Goetz et al. | |
| 6,640,091 | B1 * | 10/2003 | Shiraishi | 455/118 |
| 6,642,758 | B1 | 11/2003 | Wang et al. | |
| 6,667,641 | B1 | 12/2003 | Wang et al. | |
| 6,683,918 | B2 * | 1/2004 | Jackson et al. | 375/308 |
| 6,687,320 | B1 * | 2/2004 | Chiu et al. | 375/376 |
| 6,836,164 | B1 | 12/2004 | Wang et al. | |

(Continued)

OTHER PUBLICATIONS

Mishra et al., "Frequency Planning and Synthesizer Architectures for Multiband OFDM UWB Radios", IEEE Transactions on Microwave Theory and Techniques, vol. 53, No. 12, Dec. 2005.

(Continued)

*Primary Examiner*—Duc Nguyen
*Assistant Examiner*—Charles Chow
(74) *Attorney, Agent, or Firm*—Chad R. Walsh; Fountainhead Law Group P.C.

(57) ABSTRACT

Embodiments of the present invention include a frequency synthesizer comprising a first plurality of dividers receiving a first signal having a first frequency and generating a first plurality of divided signals and a frequency combination network including a plurality of mixers, the frequency combination network receiving one or more of the first plurality of divided signals and generating a plurality of synthesized signals having different frequencies. The frequency combination network may further include additional dividers and multiplexers for more flexibility in synthesizing different frequencies. In one embodiment, the frequency combination network is coupled to dividers in the feedback path of a phase locked loop. The present invention is particularly advantageous for synthesizing frequencies above one (1) gigahertz.

32 Claims, 14 Drawing Sheets

U.S. PATENT DOCUMENTS

| | | | |
|---|---|---|---|
| 6,977,556 B1* | 12/2005 | Petrovic et al. | 331/18 |
| 7,003,274 B1* | 2/2006 | Olip | 455/260 |
| 7,109,765 B1 | 9/2006 | Wang et al. | |
| 7,215,214 B1* | 5/2007 | Taheri et al. | 331/107 A |
| 7,336,755 B1* | 2/2008 | Tetzlaff | 375/376 |
| 2002/0028667 A1* | 3/2002 | Aoki | 455/319 |
| 2002/0077074 A1* | 6/2002 | Piazza | 455/343 |
| 2002/0183030 A1* | 12/2002 | Damgaard et al. | 455/258 |
| 2004/0263146 A1* | 12/2004 | Boerstler et al. | 324/76.53 |
| 2005/0032492 A1* | 2/2005 | Asayama et al. | 455/150.1 |
| 2005/0104634 A1* | 5/2005 | Fujishima | 327/117 |
| 2005/0255822 A1* | 11/2005 | Friedich et al. | 455/323 |
| 2006/0019700 A1* | 1/2006 | Seo et al. | 455/553.1 |
| 2006/0025946 A1* | 2/2006 | Jenkins et al. | 702/76 |
| 2006/0183455 A1* | 8/2006 | Cha et al. | 455/323 |
| 2006/0211381 A1* | 9/2006 | Jensen | 455/76 |
| 2006/0268182 A1* | 11/2006 | Shields | 348/710 |
| 2007/0008429 A1* | 1/2007 | Cha et al. | 348/528 |
| 2007/0066262 A1* | 3/2007 | Mishra | 455/260 |
| 2007/0105518 A1* | 5/2007 | Chang et al. | 455/260 |

OTHER PUBLICATIONS

Lee et al., "A Frequency Synthesizer for UWB Transceiver in 0.13/spl mu/m CMOS Technology", Silicon Monolithic Integrated Circuits in RF Systems, 2006, p. 294-297.

Sandner et al., "A 3GHz to 7GHz Fast-Hopping Frequency Synthesizer for UWB", Ultra Wideband Systems, May 18-21, 2004, p. 405-409.

Guican Chen, "A Monolithic Fast-Hopping Frequency Synthesizer for MB-OFDM UWB", Microwave Conference Proceedings, 2005, APMC 2005 Proceedings, Dec. 4-7, 2005.

JRI Lee, "A 3-8-GHz Fast-Hopping Frequency Synthesizer in 0.18-/spl mu/m CMOS technology", IEEE Journal of Solid-State Circuits, Mar. 2006, p. 566-573, vol. 41, Issue: 3.

* cited by examiner

100

HIGH FREQUENCY SYNTHESIZER CIRCUITS AND METHODS

BACKGROUND

The present invention relates to generating signals with specified frequencies, and in particular, to circuits and methods for generating high frequency signals.

Many electronic systems require signals at a variety of different frequencies to perform a variety of different functions. In many situations, a system will include some reference frequency (sometimes referred to as the system frequency). An example of such a reference frequency is a system clock. The reference frequency often provides the foundation timing reference for the system. However, many system components and subsystems may require different frequency signals to operate properly. In many cases, subsystem frequencies may vary drastically from the reference, or may have different tolerances or other unique requirements that the reference frequency cannot meet. Thus, frequency generation, which is sometimes referred to as frequency synthesis, is an important consideration in the design and development of electronic systems.

FIG. 1 is an example of a circuit commonly used to generate different frequencies based on a reference frequency. FIG. 1 illustrates a phase-locked loop ("PLL") approach to frequency synthesis. PLL 100 receives a reference frequency ("Ref") and generates an output frequency ("$f_{out}$") that has some relation to REF. For example, PLL 100 includes a phase-detector 110 ("PD"), or equivalently, a phase frequency detector ("PFD"), a charge pump 120, a loop filter 130, a voltage controlled oscillator 140 ("VCO") and a feedback circuit 150, which in this case is a divider. Divider 150 generates a feedback signal ("$f_{FB}$") having a frequency that is some fraction of the VCO output frequency ("$f_{out}$"). By the action of the loop, the outputs of the phase detector, charge pump and loop filter generate a control voltage to the VCO that results in a feedback signal that is at the same frequency as REF. The output frequency of the VCO, which may also be the output of the synthesizer, is thus some multiple of the reference signal frequency.

While the approach illustrated in FIG. 1 works well in many applications, there are some applications where such an architecture is inadequate. For example, some applications may require many different frequencies for particular subsystems. FIG. 2 illustrates one application where multiple frequency synthesis is required. FIG. 2 illustrates frequency bands that may be used to transmit information in a channel (e.g., a wireless channel). In this example, there are three channels 201, 202, and 203. Thus, the subsystem used for modulating the signals into the channel would require three different carrier frequencies $f_1$, $f_2$ and $f_3$ to transfer information in each channel.

One example approach to multi-band transmission that illustrates one of the problems with standard synthesizers is shown in FIG. 3. FIG. 3 shows a transmission scheme of a wireless system. At 301 the system may lock onto the first frequency $f_1$. At 302, the system may transfer data in the channel with $f_1$ being the modulation frequency. At 303, the system may change channels, and the synthesizer must change to a new frequency $f_2$. At 304, the system may transfer data in the new channel with $f_2$ being the new modulation frequency. While a single PLL synthesizer is beneficial from the perspective of efficiency and cost (i.e., it reduces power consumption and the size of the circuit), such a synthesizer must be able to change frequencies between each transmission. These frequency changes are sometimes referred to as "channel hopping." Such an implementation may not work at high frequencies where the channel hopping requirements may become too stringent for the PLL. For example, some systems may require that the PLL switch between frequencies in less than 10 ns.

FIG. 4 illustrates one possible approach to meet stringent channel hopping requirements. FIG. 4 includes one PLL for each channel, wherein each PLL generates a different modulation frequency for use in each channel. In this case, any one of the three PLLs 401-403 may be selected using a multiplexer 404 ("MUX"), and the output of the MUX is used to modulate the signal being transmitted. While this approach may meet the stringent channel hopping requirements (i.e., because the PLLs do not change frequency), it is nevertheless less desirable than a signal PLL solution because it consumes more power requires about three times the circuit area. Moreover, if multiple PLLs are included on a single integrated circuit, the crosstalk of the circuit will increase from the activity of the multiple PLLs.

Thus, there is a need for improved frequency synthesizer techniques that can effectively generate frequencies in a multi-frequency environment.

SUMMARY

Embodiments of the present invention include a frequency synthesizer comprising a first plurality of dividers receiving a first signal having a first frequency and generating a first plurality of divided signals and a frequency combination network including a plurality of mixers, the frequency combination network receiving one or more of the first plurality of divided signals and generating a plurality of synthesized signals having different frequencies. The frequency combination network may further include additional dividers and multiplexers for more flexibility in synthesizing different frequencies.

In one embodiment, the present invention includes a frequency synthesizer comprising a phase detector having a first input that receives a reference signal having a reference frequency and a second input that receives a feedback signal, a charge pump coupled to the phase detector, a filter coupled to the charge pump, a voltage controlled oscillator coupled to the filter, a first plurality of dividers coupled to the output of the voltage controlled oscillator that generate a first plurality of divided signals, a digital divider coupled between the first plurality of dividers and the second input of the phase detector, a plurality of mixers coupled to first plurality of divided signals, the mixers generating a plurality of synthesized frequencies and a first multiplexer having inputs coupled to two or more of the synthesized frequencies and a select input for coupling one of the synthesized frequencies to a multiplexer output.

In one embodiment, the present invention includes a frequency synthesis method comprising generating a first signal in a phase locked loop having a first frequency, generating a plurality of divided signals from the first signal, combining two or more of the divided signals in one or more mixers to produce one or more synthesized mixer output signals and coupling one of the plurality of synthesized mixer output signals to an output.

DETAILED DESCRIPTION

Figure 1:
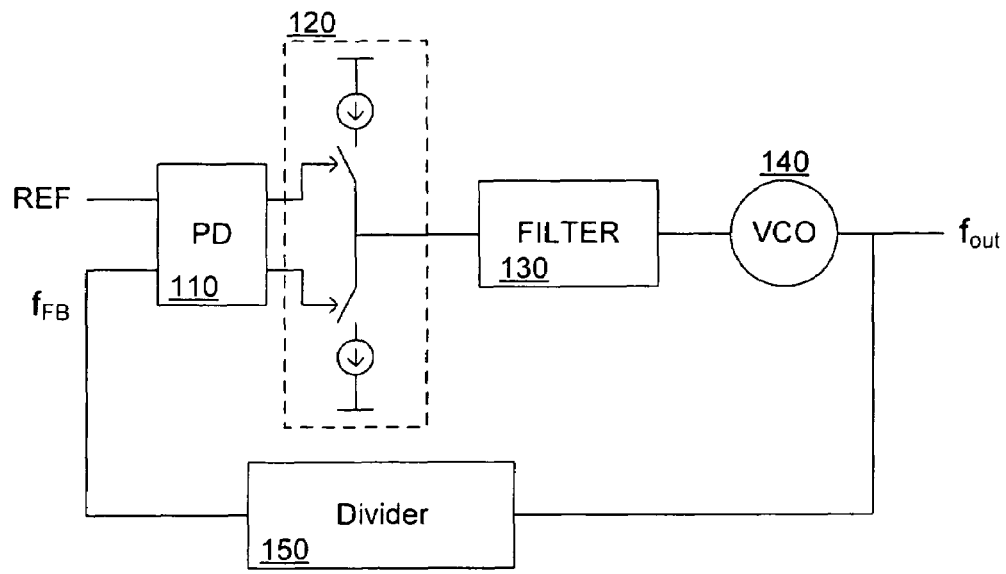
FIG. 1 is an example of a circuit commonly used to generate different frequencies based on a reference frequency.
Figure 2:
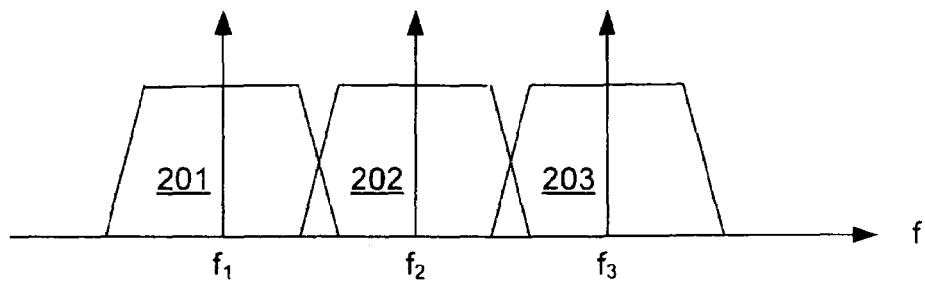
FIG. 2 illustrates a frequency bands that may be used to transmit information in a channel.
Figure 3:
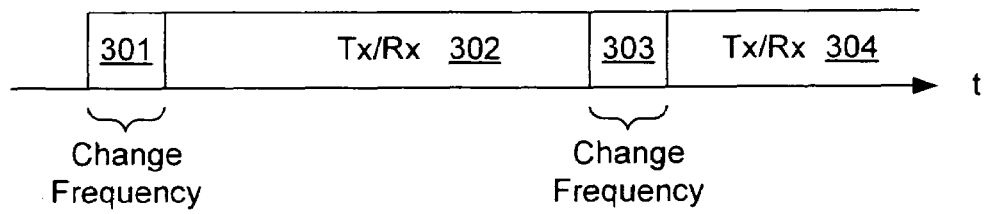
FIG. 3 shows a transmission scheme of a wireless system.
Figure 4:
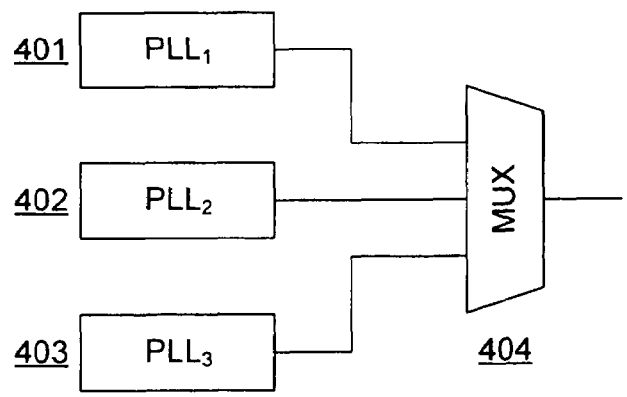
FIG. 4 illustrates one possible approach to meet stringent channel hopping requirements.
Figure 5:
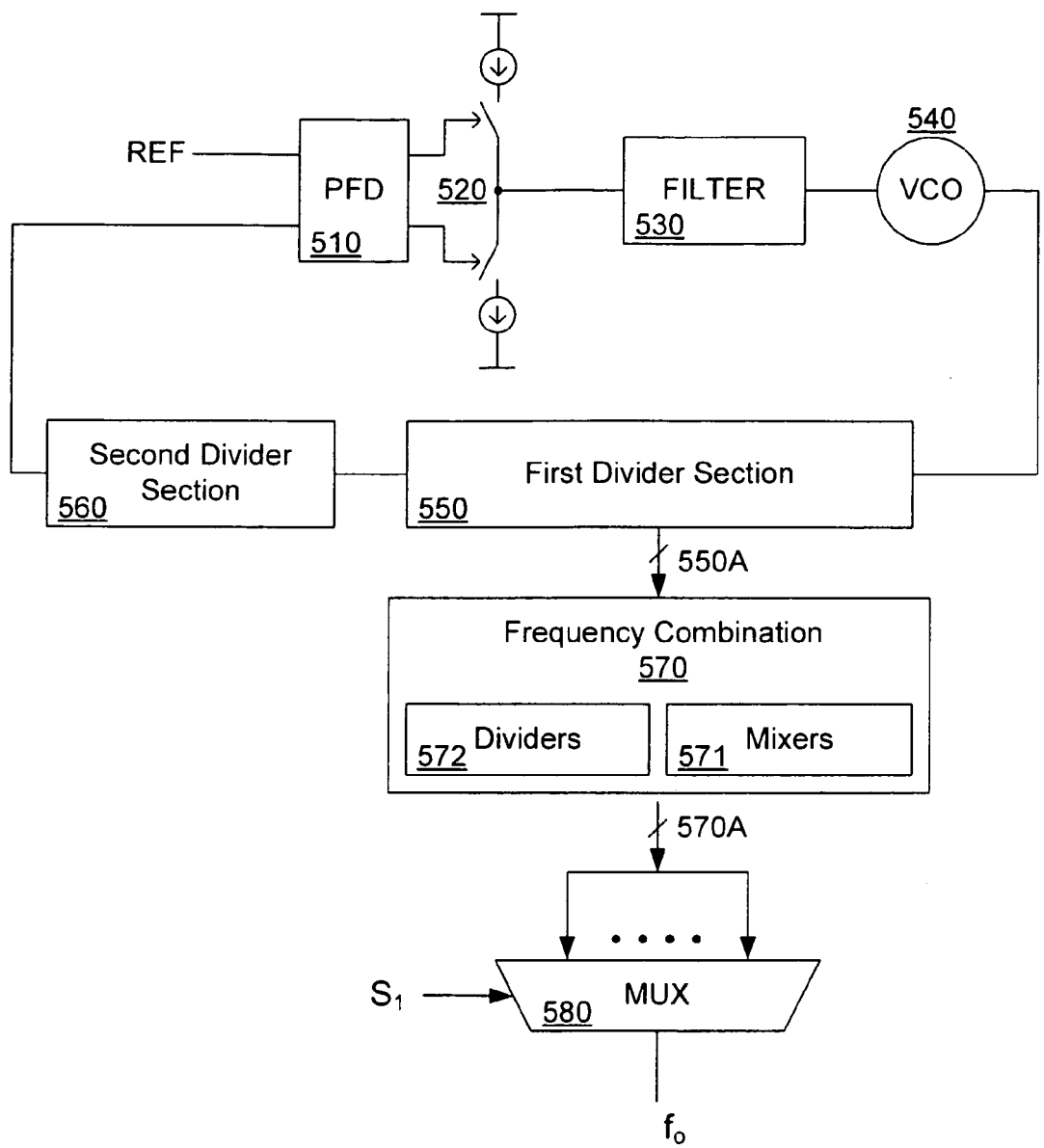
FIG. 5 illustrates a frequency synthesizer according to one embodiment of the present invention.

FIG. 5 illustrates a frequency synthesizer according to one embodiment of the present invention. In this embodiment, the frequencies are derived from the feedback path of a PLL. Thus, frequency synthesizer 500 includes a phase-frequency detector 510, charge pump 520, loop filter 530 and VCO 540. The output of VCO 540 is coupled to a second input of phase detector 510 through the feedback path of the PLL. The feedback path includes two feedback divider sections. A first divider section 550 receives the signals generated by VCO 540 and generates a plurality of divided signals 550A. The first divider section may include series coupled dividers each generating a signal that is some fraction of its input, for example. Such signals are divided versions of the VCO output signal. The second divider section 560 is coupled to the output of first divider section 550 and receives a signal that has a lower frequency than the VCO output signal.

One feature of the present invention is that the feedback path uses two different divider architectures. This technique is particularly advantageous for synthesizing very high frequencies (e.g., above one (1) gigahertz). For example, at very high VCO output frequencies, the circuits in the first divider section may be designed to operate above some particular frequency (e.g., one (1) gigahertz), whereas the circuits in the second divider section may be designed to operate at lower frequencies but cannot operate above some particular frequency. In one embodiment, first divider section 550 may include dividers that are each designed to operate across particular frequency ranges, allowing the system to operate at very high frequencies.

The divided signals 550A are received by a frequency combination network 570. Frequency combination network 570 includes a plurality of mixers 571 that may be used to add or subtract various combinations or subcombinations of the divided signals 550A to generate a plurality of synthesized mixer output signals 570A. Mixers 571 may be configured in parallel or in series or both to generate the desired frequency signals. Frequency combination network 570 may further include dividers 572 that may be used to divide the divided signals 550A or the output signals of mixers 571 to generate yet more frequencies. Intermediate multiplexers may be used to selectively couple different signals to mixer inputs. Frequency combination network 570 generates a plurality of synthesized signals 570A. Synthesized signals 570A are coupled to multiple inputs of a multiplexer 580. Desired signals may be selected by multiplexer select line "$S_1$," and the desired frequency signal is transmitted to the output of the multiplexer, $f_o$.

Thus, synthesizer 500 illustrates a frequency synthesis method comprising generating a first signal in a phase locked loop having a first frequency, generating a plurality of divided signals 550A from the first signal, combining two or more of the divided signals in a plurality of mixers 571A to produce a plurality of synthesized signals 570A and coupling one of the plurality of output signals to an output. The method may also include further dividing the divided signals 550A before or after mixing such signal in a mixer as illustrated below.

Figure 6A:
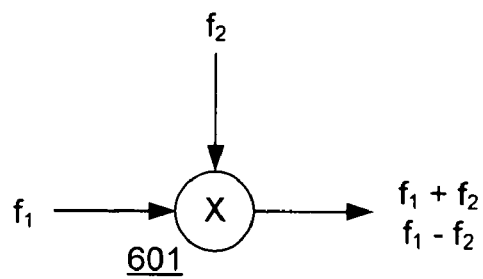
FIGS. 6A-C are examples of how frequencies may be combined according to embodiments of the present invention.
Figure 6B:
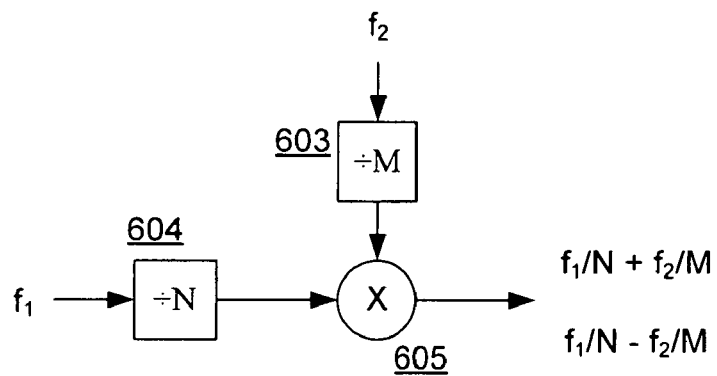
Figure 6C:
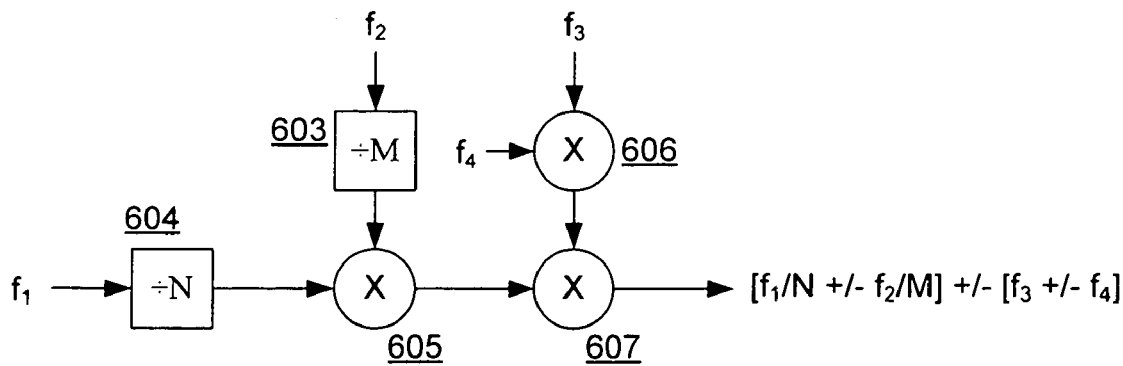

FIGS. 6A-C are examples of how frequencies may be combined according to embodiments of the present invention. FIG. 6A shows how a mixer 601 may be used to combine frequencies $f_1$ and $f_2$. In one embodiment, single sideband mixers, which are sometimes referred to as image rejection mixers, may be used to generate either the sum or the difference of the input frequencies. Mixers that are configured to produce a signal having a frequency equal to the sum of the frequencies of the inputs signals are referred to herein as summing mixers. Mixers that are configured to produce a signal having a frequency equal to the difference of the frequencies of the inputs signals are referred to herein as subtracting mixers (or equivalently, difference mixers). In one embodiment only the sum of the input frequencies (i.e., $f_o=f_1+f_2$) may be generated at the output of the mixer. In another embodiment, only the difference of the input frequencies (i.e., $f_o=f_1-f_2$) may be generated at the output of the mixer. FIG. 6B illustrates how dividers may optionally be used to generate yet other frequencies. For example, a first input signal having a frequency, $f_1$, may be received at the input of a divider 604 (i.e., divide-by-N), and the output of divider 604 is applied to a first input of mixer 605. A second input signal having a second frequency, $f_2$, may be received at the input of divide-by-M 603, and the output of divider 603 is applied to the other input of mixer 605. Thus, in one embodiment, the output of mixer 605 may be either $f_o=f_1/N-f_2/M$ or $f_o=f_1/N+f_2/M$. FIG. 6C illustrates how mixers may be configured in series or in parallel or both to generate more frequencies. As in FIG. 6B, the output of mixer 605 may be either $f_o=f_1/N-f_2/M$ or $f_o=f_1/N+f_2/M$, and from FIG. 6A the output of mixer 606 may be either $f_o=f_3-f_4$ or $f_o=f_3+f_4$. Any desired combination of input signals and mixer output signals may be combined in mixer 607 to generate the frequencies of interest. The frequencies that may be obtained at the output of mixer 607 are as follows:

$$f_o = [f_1/N +/- f_2/M] +/- [f_3 +/- f_4].$$

It is to be understood that the particular configuration of mixers or dividers used depends on the particular frequencies that are needed in the system and that other combinations or variants of FIGS. 6A-C are equivalent. For example, M or N may be equal to 1, or $f_3$ and/or $f_4$ may be derived from $f_1$ and/or $f_2$. Furthermore, additional mixers and/or dividers may combined in parallel or in series to generate the desired frequencies, and the frequency combination network may include internal intermediate multiplexers to route the various signals between internal components (e.g., mixers or dividers) and/or to the output. Examples of these techniques are described below.

Figure 7A:
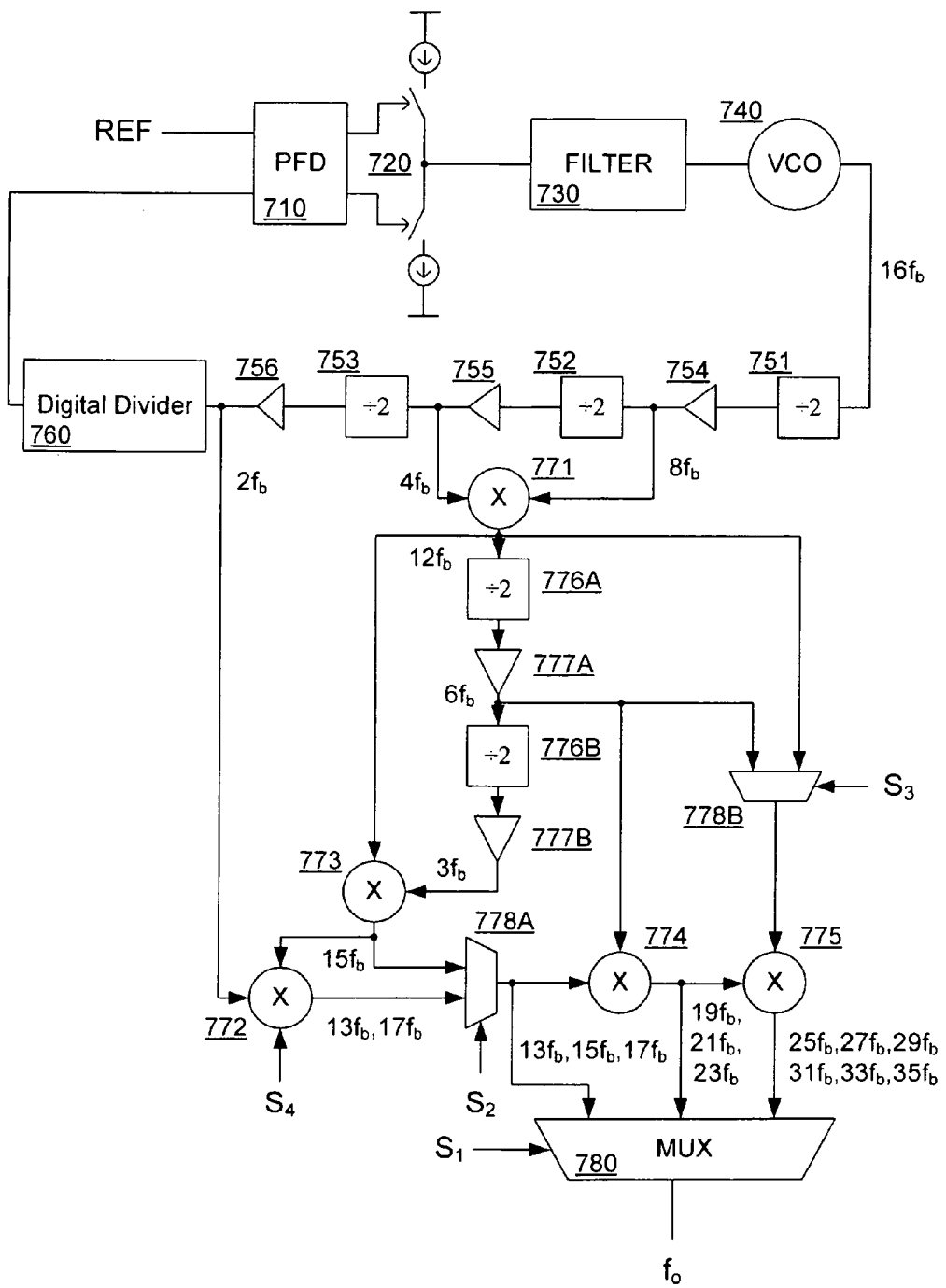
FIG. 7A is an example of a frequency synthesizer according to one specific embodiment of the present invention.

FIG. 7A is an example of a frequency synthesizer according to one specific embodiment of the present invention. Frequency synthesizer 700 includes a phase-frequency detector 710, charge pump 720, filter 730, voltage-controlled oscillator 740, high frequency analog dividers 751-756 and a digital divider 760 configured in a loop (i.e., a phase locked loop). In this example, analog dividers comprise divide-by-two circuits 751-753 and buffers 754-756, and the frequency combination network includes mixers 771-775, divide-by-two circuits 776A-B, buffers 777A-B and intermediate multiplexers 778A-B. The frequency combination network includes a plurality of synthesized signals that are coupled to inputs of output select multiplexer 780. Output select multiplexer 780 can selectively transmit any one of the synthesized signals to the output under the control of output select line "$S_1$." Each select line may include a plurality of conductive traces (e.g., metalizations or polysilicon conductors) with signals that control internal switches such as a MOS transistor, for example. The signals on each select line may be generated by a system controller (not shown), for example.

The output of buffer 754, which is a signal at a frequency of one-half the VCO frequency, is combined with the output of buffer 755, which is a signal at a frequency of one-forth the VCO frequency, in mixer 771. The output of mixer 771 is coupled to a first input of mixer 773. The second input of mixer 773 is coupled to the output of mixer 771 through dividers 776A-B and buffers 777A-B, which are configured in series. The output of mixer 773 is coupled to a first input of mixer 772, and the second input of mixer 772 is coupled to the output of buffer 756 in the analog divider to receive a divided version of the VCO, which in this case is a signal at one-eighth the VCO frequency. The output of mixer 772 is coupled through multiplexer 778A to a first input of output select multiplexer 780. The output of mixer 773 is also coupled through multiplexer 778A to the first input of output select multiplexer 780.

The output of multiplexer 778A is also coupled to a first input of mixer 774. Thus, mixer 774 may selectively receive either the output of mixer 772 or mixer 773 under control of select line "$S_2$". The second input of mixer 774 is coupled to the output of buffer 777A, which is a signal at one-half the frequency of the output of mixer 771. The output of mixer 774 is coupled to a first input of mixer 775 and to a second input of output select multiplexer 780. The second input of mixer 775 is selectively coupled to either the output of mixer 771 or the output of buffer 777A through multiplexer 778B under control of select line "$S_3$." The output of mixer 775 is coupled to a third input of output select multiplexer 780.

In one embodiment, dividers 751-753 are analog dividers. Analog dividers 550 are different from digital divider 560 in that they use analog design techniques to implement the division, whereas digital divider 560 uses digital techniques. This difference is most easily seen in that digital circuits process substantially ideal square waves (i.e., binary signal values), whereas analog circuits process non-ideal square wave signals. At high frequencies (i.e., above 1 gigahertz) the output of the VCO is not a clean digital signal (i.e., not a clean square wave), but rather, an approximately sinusoidal signal. For example, embodiments of the present invention may include VCOs that produce 400 mV peak-to-peak sinusoidal signals at frequencies above 4 GHz. At such frequencies, the feedback dividers cannot rely exclusively on digital techniques to implement the division. Consequently, high frequency analog dividers are required to process the VCO output. Example digital divider techniques may include divider circuits that operate below one (1) gigahertz (such as flip-flops), whereas analog dividers may include high frequency divider circuits that operate at and above one (1) gigahertz. Analog dividers may also include circuits that are designed to operate across a range of high frequencies above one (1) gigahertz. Such analog dividers may include LC circuits that may not be effective above or below the intended range.

Example high-frequency analog divider circuits that may be used in the present invention are disclosed in commonly-owned concurrently filed U.S. Pat. No. 7,298,183, entitled "High Frequency Divider Circuits and Methods," naming Ahmad Mirzaei, Mohammed E Heidari, Masoud Djafari, and Rahim Bagheri as inventors, the full disclosure of which is hereby incorporated herein by reference. Other examples of high-frequency analog divider circuits that may be used in the present invention are disclosed in commonly-owned concurrently filed U.S. Pat. No. 7,403,048, entitled "Divider Circuits and Methods Using In-Phase and Quadrature Signals," naming Ahmad Mirzaei, Mohammed E Heidari, Masoud Djafari, and Rahim Bagheri as inventors, the full disclosure of which is hereby incorporated herein by reference.

The present example is particularly useful in generating frequencies above one (1) gigahertz that are multiples of a given frequency (e.g., a base frequency, $f_b$, which is the VCO output frequency). For example, in one embodiment the output of the VCO is sixteen (16) times the base frequency (e.g., $16f_b = 16*264$ MHz=4.224 GHz, where the base frequency is 264 MHz). Thus, at the output of buffer 754 the frequency is eight (8) times the base frequency, $8f_b$, at the output of buffer 755 the frequency is four (4) times the base frequency, $4f_b$, and at the output of buffer 756 the frequency is two (2) times the base frequency, $2f_b$, which in this case is less than one (1) gigahertz and may be divided using standard digital techniques. In this example, the reference frequency, REF, may be 11 MHz and the digital divider may be a divide-by-48, for example.

In this example, mixer 771 is a single sideband summing mixer (i.e., the output is the sum of the input frequencies). Thus, the output of mixer 771 is twelve (12) times the base frequency, $12f_b$, and the output of buffer 777B is three (3) times the base frequency, $3f_b$. In this example, mixer 773 is also a summing mixer, so the output of mixer 773 is the sum of $3f_b$ and $12f_b$, which is fifteen (15) times the base frequency, $15f_b$. Furthermore, in this example mixer 772 may produce either the sum or difference of the inputs under control of a select signal "$S_4$" received on a configuration control terminal. Thus, a control terminal may be used to configure mixer 772 as either a summing mixer or subtracting mixer to generate the difference of $2f_b$ and $15f_b$ to produce $13f_b$ or generate the sum of $2f_b$ and $15f_b$ to produce $17f_b$. Multiplexer 778A, together with mixer select signal "$S_4$", may be used to couple any one of $13f_b$, $15f_b$ or $17f_b$ to the first input of output select multiplexer 780.

Additional frequencies are generated by mixer 774, which receives the output of buffer 777A at $6f_b$ on one input and any one of the $13f_b$, $15f_b$ or $17f_b$ outputs of multiplexer 778A on the second input. Mixer 774 is a summing mixer. Thus, the output of mixer 774 is either $19f_b$, $21f_b$ or $23f_b$ depending on the frequency of the signal at the second input as controlled by select lines "$S_2$" and "$S_4$." The output of mixer 774 is coupled to the second input of output select multiplexer 780.

Mixer 775 may receive any one of frequencies $19f_b$, $21f_b$ or $23f_b$ from mixer 774 on one input and may receive one of either $6f_b$ or $12f_b$ on the second input under the control of multiplexer 778B and select line $S_3$. Mixer 775 is also a summing mixer, so the output may be any one of $25f_b$, $27f_b$, $29f_b$, $31f_b$, $33f_b$ or $35f_b$. The final output frequency of the system may be selected by select line "$S_1$." From the above description, it can be seen that any one of the following multiples of a base frequency, $f_b$, may be generated at the output under the control of select lines $S_1$, $S_2$, $S_3$, $S_4$: $13f_b$, $15f_b$, $17f_b$, $19f_b$, $21f_b$, $23f_b$, $25f_b$, $27f_b$, $29f_b$, $31f_b$, $33f_b$ or $35f_b$.

Embodiments of the present invention further include a method that results in reduced power consumption of the synthesizer during operation. For instance, one advantage of the present invention is that particular mixers or dividers may be turned off when their output signals are not needed for frequency synthesis. For example, in synthesizer 700, when the desired output is $19f_b$, $21f_b$ or $23f_b$, mixer 775 may be turned off, resulting in advantageous power reductions. Similarly, when the desired output is either $13f_b$ or $17f_b$, mixers 774 and 775 may be turned off. Finally, when the desired output is $15f_b$, mixers 772, 774, and 775 may be turned off, resulting in even greater power reductions. Thus, embodiments of the present invention include turning off at least one of the plurality of mixers (e.g., mixer 775) when the mixer's output signal (e.g., $25f_b$) is not coupled to the output and turning on the at least one of the plurality of mixers (e.g., mixer 775) when the mixer's output signal (e.g., $25f_b$) is coupled to the output.

Figure 7B:
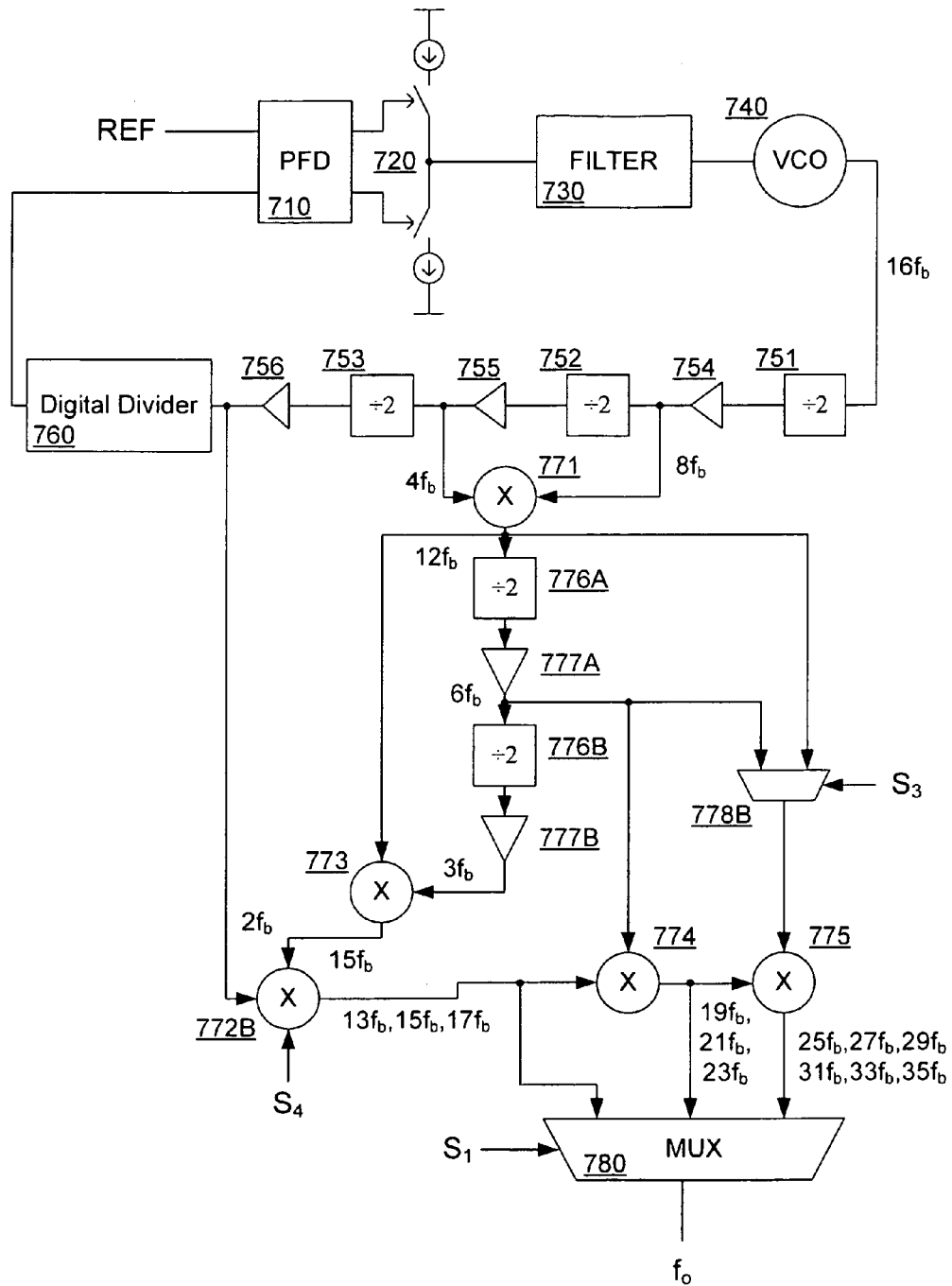
FIG. 7B is an example of a frequency synthesizer according to another specific embodiment of the present invention.

FIG. 7B is an example of a frequency synthesizer 700B according to another specific embodiment of the present invention. In frequency synthesizer 700B, mixer 772 has been modified to act as both a mixer and a buffer, thereby eliminating multiplexer 778A. Mixer 772B receives a select line S4 that, in one state, configures the mixer to be a subtracting (or difference) mixer. In another state, mixer 772B is a buffer for the signal received from mixer 773. In yet another state, mixer 772B is a summing mixer. Thus, using select line S4, mixer 772B is used to generate either $13f_b$ (the difference between the inputs), $15f_b$ (the buffered input from mixer 773, or $17f_b$ (the summed of the inputs).

Figure 8:
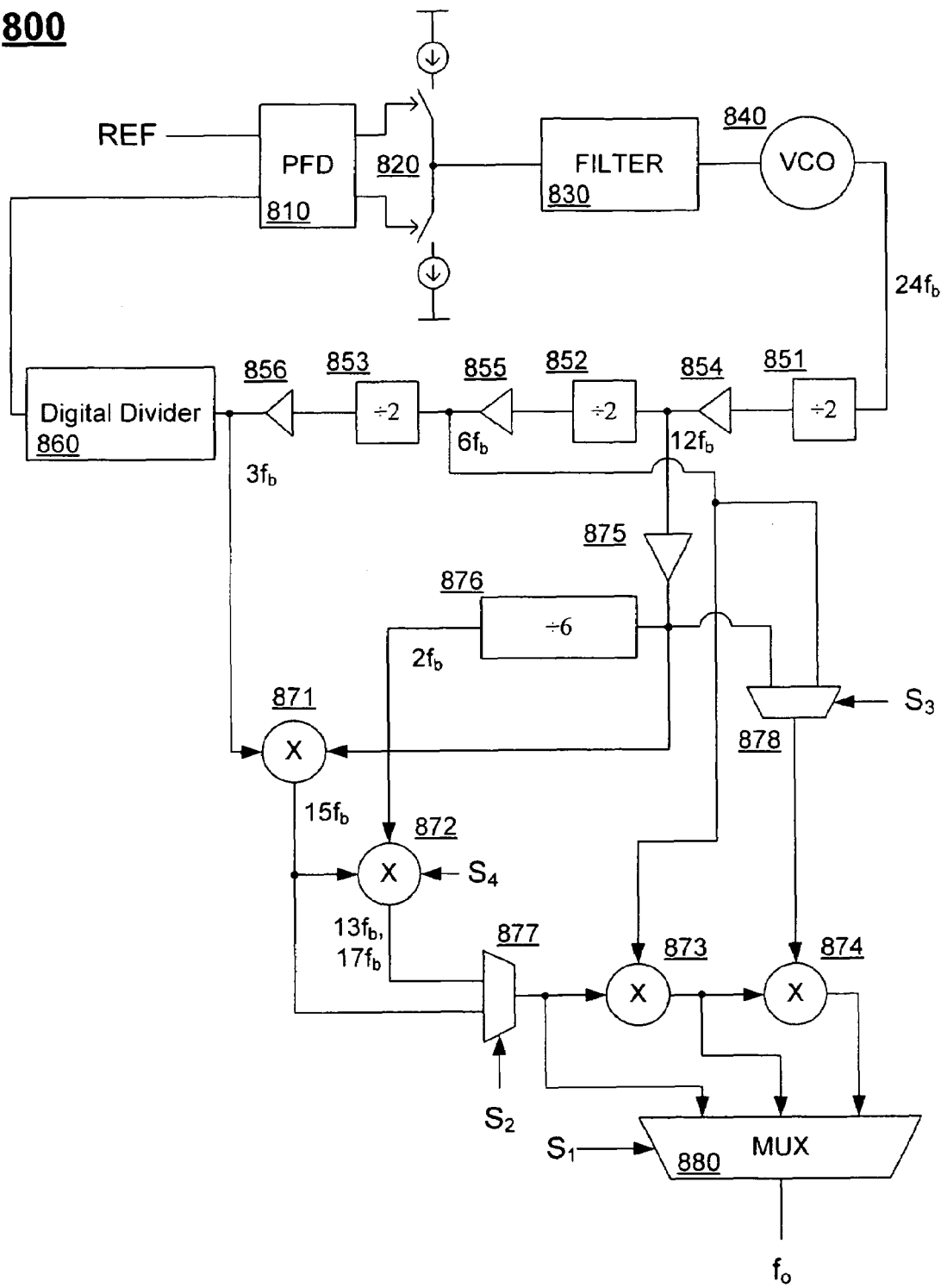
FIG. 8 is an example of a frequency synthesizer according to another embodiment of the present invention

FIG. 8 is an example of a frequency synthesizer according to another embodiment of the present invention. Frequency synthesizer 800 includes a phase-frequency detector 810, charge pump 820, filter 830, voltage-controlled oscillator 840, high frequency analog dividers 851-856 and a digital divider 860 configured in a loop. In this example, analog dividers comprise divide-by-two circuits 851-853 and buffers 854-856, and the frequency combination network includes mixers 871-874, divide-by-six circuit 876, buffer 875 and intermediate multiplexers 877-878. The frequency combination network includes a plurality of synthesized signals that are coupled to inputs of output select multiplexer 880. Output select multiplexer 880 can selectively transmit any one of the synthesized signals to the output under the control of output select line "$S_1$."

The output of buffer 854, which is a signal at a frequency of one-half the VCO frequency, is combined with the output of buffer 856, which is a signal at a frequency of one-eighth the VCO frequency, in mixer 871. The output of mixer 871 is coupled to a first input of multiplexer 877 and to a first input of mixer 872. The second input of mixer 872 is coupled to the output of buffer 854 through divider-by-six 876 and buffer 875. The output of mixer 872 is coupled to a second input of multiplexer 877. The output of multiplexer 877 is coupled to a first input of output select multiplexer 880. Thus, the outputs of both mixer 871 and 872 are coupled through multiplexer 877 to the first input of output select multiplexer 880.

The output of multiplexer 877 is also coupled to a first input of mixer 873. Thus, mixer 873 may selectively receive either the output of mixer 871 or mixer 872 under control of select line "$S_2$". The second input of mixer 873 is coupled to the output of buffer 855, which is a signal at one-forth the frequency of the VCO. The output of mixer 873 is coupled to a first input of mixer 874 and to a second input of output select multiplexer 880. The second input of mixer 874 is selectively coupled to either the output of buffer 875 (i.e., a signal at one-half the frequency of the VCO) or the output of buffer 855 (i.e., a signal at one-forth the frequency of the VCO) through multiplexer 878 under control of select line "$S_3$." The output of mixer 874 is coupled to a third output of output select multiplexer 880.

The present example illustrates an alternative embodiment for generating frequencies that are odd multiples of a given frequency (herein, the base frequency, $f_b$) as shown in FIG. 7 in order to illustrate the flexibility of the invention. For example, in one embodiment the output of VCO 840 is twenty-four (24) times the base frequency (e.g., $24f_b$=24*264 MHz=6.336 GHz, where the base frequency is again 264 MHz). Thus, at the output of buffer 854 the frequency is twelve (12) times the base frequency, $12f_b$, at the output of buffer 855 the frequency is six (6) times the base frequency, $6f_b$, and at the output of buffer 856 the frequency is three (3) times the base frequency, $3f_b$. In this example, the reference frequency, REF, may be 11 MHz and the digital divider may be a divide-by-72 (e.g., two divide-by-threes and three divide-by-twos coupled in series).

In this example mixer 871 is a single sideband summing mixer. Thus, the output of mixer 871 is the sum of $12f_b$ (the output of buffer 854) and $3f_b$ (the output of buffer 856, which is fifteen (12) times the base frequency, $12f_b$. Furthermore, in this example mixer 872 may produce either the sum or difference of the inputs under control of select line "$S_4$." Thus, mixer 872 may generate the difference of $2f_b$ (the output of divide-by-six 876) and $15f_b$ to produce $13f_b$, or generate the sum of $2f_b$ and $15f_b$ to produce $17f_b$. Multiplexer 877, together with mixer control signal "$S_4$", may be used to couple any one of $13f_b$, $15f_b$ or $17f_b$ to the first input of output select multiplexer 880.

Additional frequencies are generated by mixer 873, which receives the output of buffer 855 at $6f_b$ on a first input and any one of the $13f_b$, $15f_b$ or $17f_b$ outputs of multiplexer 877 on the second input. Mixer 873 is a summing mixer. Thus, the output of mixer 873 is either $19f_b$, $21f_b$ or $23f_b$ depending on the frequency of the signal at the second input as controlled by select lines "$S_2$" and "$S_4$." The output of mixer 873 is coupled to the second input of output select multiplexer 880.

Mixer 874 may receive any one of frequencies $19f_b$, $21f_b$ or $23f_b$ from mixer 873 on one input and may receive one of either $6f_b$ or $12f_b$ on the second input under the control of multiplexer 878 and select line $S_3$. Mixer 874 is also a summing mixer, so the output may be any one of $25f_b$, $27f_b$, $29f_b$, $31f_b$, $33f_b$ or $35f_b$. The final output frequency of the system may be selected by select line "$S_1$." From the above description, it can be seen that any one of the following multiples of a base frequency, $f_b$, may be generated at the output under the control of select lines $S_1$, $S_2$, $S_3$, $S_4$: $13f_b$, $15f_b$, $17f_b$, $19f_b$, $21f_b$, $23f_b$, $25f_b$, $27f_b$, $29f_b$, $31f_b$, $31f_b$ or $35f_b$.

Embodiments of the present invention may also be implemented using both in-phase and quadrature signals. For example, in one embodiment the VCO generates complementary in-phase signals (herein, +I and −I). In this case, the first analog feedback divider (e.g., divider 751 of FIG. 7 or 851 of FIG. 8) may receive the complementary signals and generate both complementary in-phase signals and complementary quadrature signals (herein, +Q and −Q). Quadrature signals are 90° (i.e., 90 degrees) out of phase with the in-phase signals. An example divide-by-two circuit that may be used in the present invention is disclosed in commonly-owned concurrently filed U.S. Pat. No. 7,298,183, entitled "High Frequency Divider Circuits and Methods," naming Ahmad Mirzaei, Mohammad E Heidari, Masoud Djafari, and Rahim Bagheri as inventors, the full disclosure of which was incorporated herein by reference above. After the complete signal set has been generated (i.e., +I, −I, +Q, −Q), internal dividers, mixers, buffers and multiplexers are balanced. Examples of divider circuits using in-phase and quadrature signals that may be used in the present invention are disclosed in commonly-owned concurrently filed U.S. Pat. No. 7,403,048, entitled "Divider Circuits and Methods Using In-Phase and Quadrature Signals," naming Ahmad Mirzaei, Mohammad E Heidari, Masoud Djafari, and Rahim Bagheri as inventors, the full disclosure of which was hereby incorporated herein by reference above.

Figure 9A:
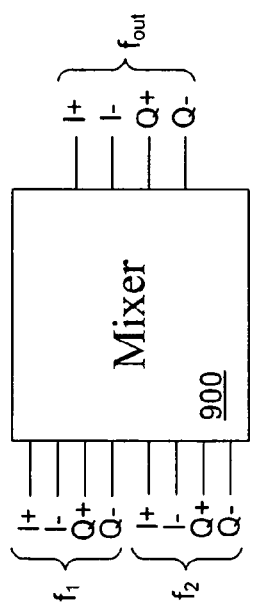
FIGS. 9A-B illustrate a mixer that may be used in embodiments of the present invention.
Figure 9B:
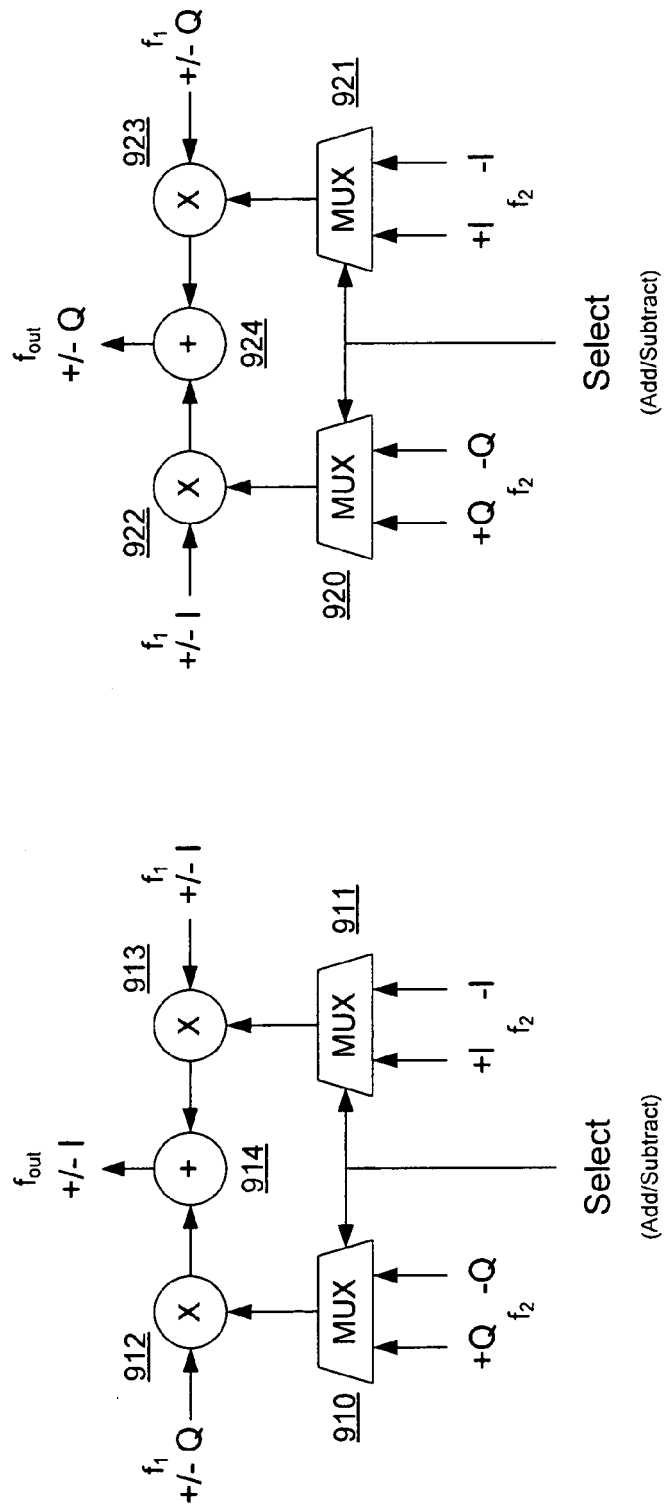

FIGS. 9A-B illustrate a mixer 900 that may be used in embodiments of the present invention. Mixer 900 is a balanced in-phase and quadrature ("I/Q") mixer. A balanced I/Q mixer receives complementary I and Q components (i.e., +I, −I, +Q, −Q) on the inputs and produces complementary I and Q components on the output. For example, mixer 900 receives two input signals $f_1$ and $f_2$ that each includes complementary I and Q components. Mixer 900 produces a balanced output signal, $f_{out}$, that also includes complementary I and Q components. As shown in FIG. 9B, complementary in-phase components ("+/−I") of the output signal are generated using multiplexers 910-911, mixer circuits 912-913 and a summing circuit 914. To obtain in-phase output components, mixer 912 receives complementary quadrature components of the first input signal $f_1$ on the first input, and either the positive or negative quadrature component of the second signal $f_2$ on the second input. Mixer 913 receives complementary in-phase components of the first input signal $f_1$ on the first input, and either the positive or negative in-phase component of the second signal $f_2$ on the second input. The outputs of mixer 912 and 913 are summed at 914 to produce complementary in-phase outputs.

Quadrature output components are obtained using the same architecture with different inputs. Mixer 922 receives complementary in-phase components of the first input signal $f_1$ on the first input, and either the positive or negative quadrature component of the second signal $f_2$ on the second input. Mixer 923 receives complementary quadrature components of the first input signal $f_1$ on the first input, and either the positive or negative in-phase component of the second signal $f_2$ on the second input. The outputs of mixer 922 and 923 are summed at 924 to produce complementary quadrature outputs. Multiplexers 910, 911, 920 and 921 include control terminals that are used to select between single side band summing mixer mode and single sideband subtraction mode. For instance, when the multiplexers are in a first state, +Q and +I are provided to mixers 912 and 913. In this state, the output is the sum of the input frequencies. When the multiplexers are in a second state, −Q and −I are provided to mixers 912 and 913. In this state, the output is the difference of the inputs frequencies.

Figure 9C:
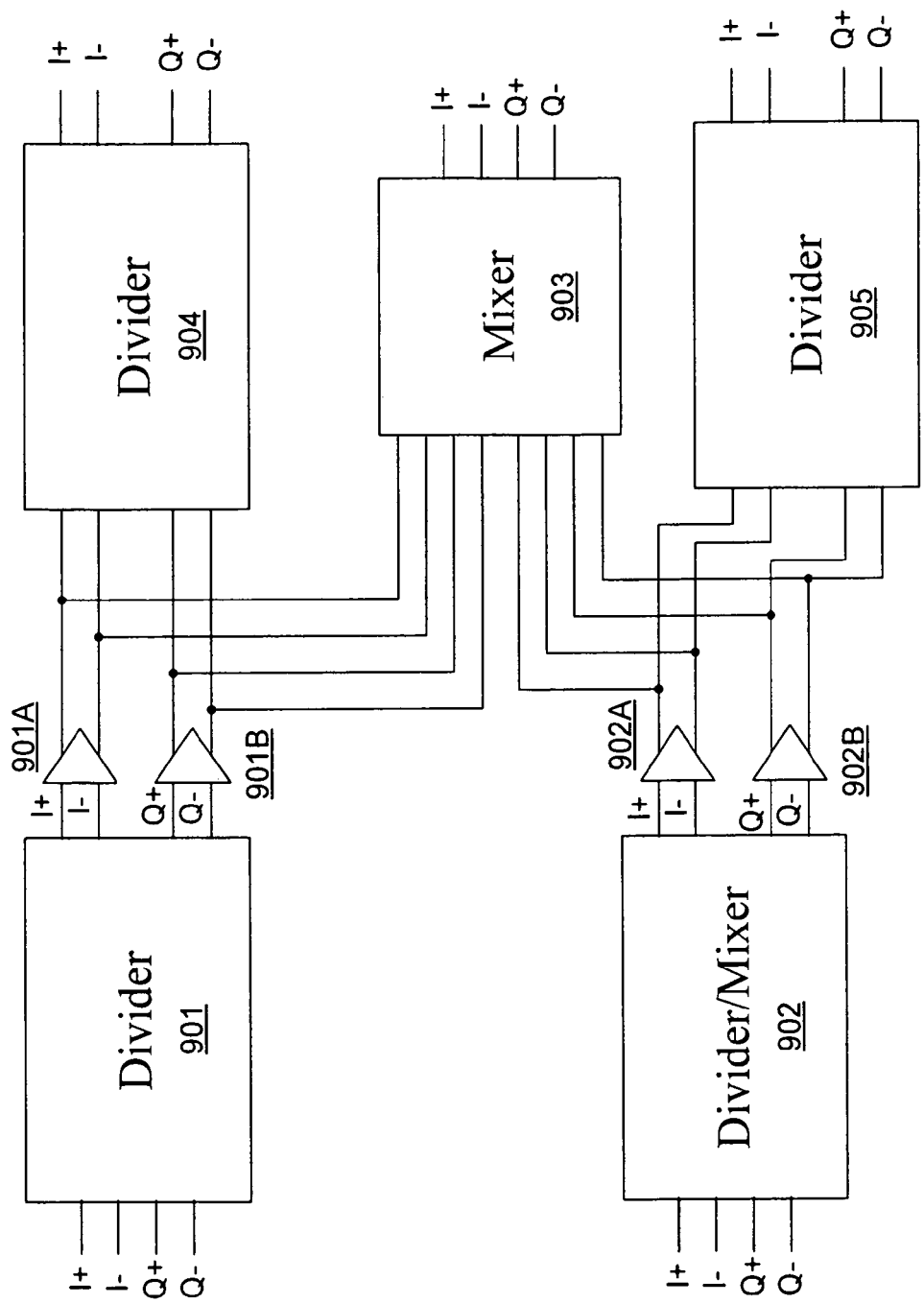
FIG. 9C illustrates another embodiment of the present invention using in-phase and quadrature signals.

FIG. 9C illustrates another embodiment of the present invention using in-phase and quadrature signals. In one embodiment, the present invention includes circuits that using both in-phase and quadrature signals in dividers and/or mixers. For example, a divider 901 may include four inputs that receive both in-phase (I+, I−) signals and quadrature (Q+, Q−) signals and four outputs that produce both in-phase (I+, I−) and quadrature (Q+, Q−) output signals. Additionally, such circuits may be coupled in series and/or in parallel as shown in FIG. 9C. For example, a mixer 903 may be coupled to the I and Q outputs of divider 901. A second divider or another mixer 902 may be coupled to a second set of I and Q inputs on mixer 903. In one embodiment, divider 901 may also be coupled to divider 904. Buffers 901A-B may be used to increase the drive capability and maintain the integrity of the I and Q signals when such signals are coupled to multiple inputs. Similarly, the I and Q outputs of a mixer (e.g., 902) may be coupled to the I and Q inputs of a divider 905. Buffers 902 may be used when divider or mixer 902 is coupled to multiple inputs.

Figure 10A:
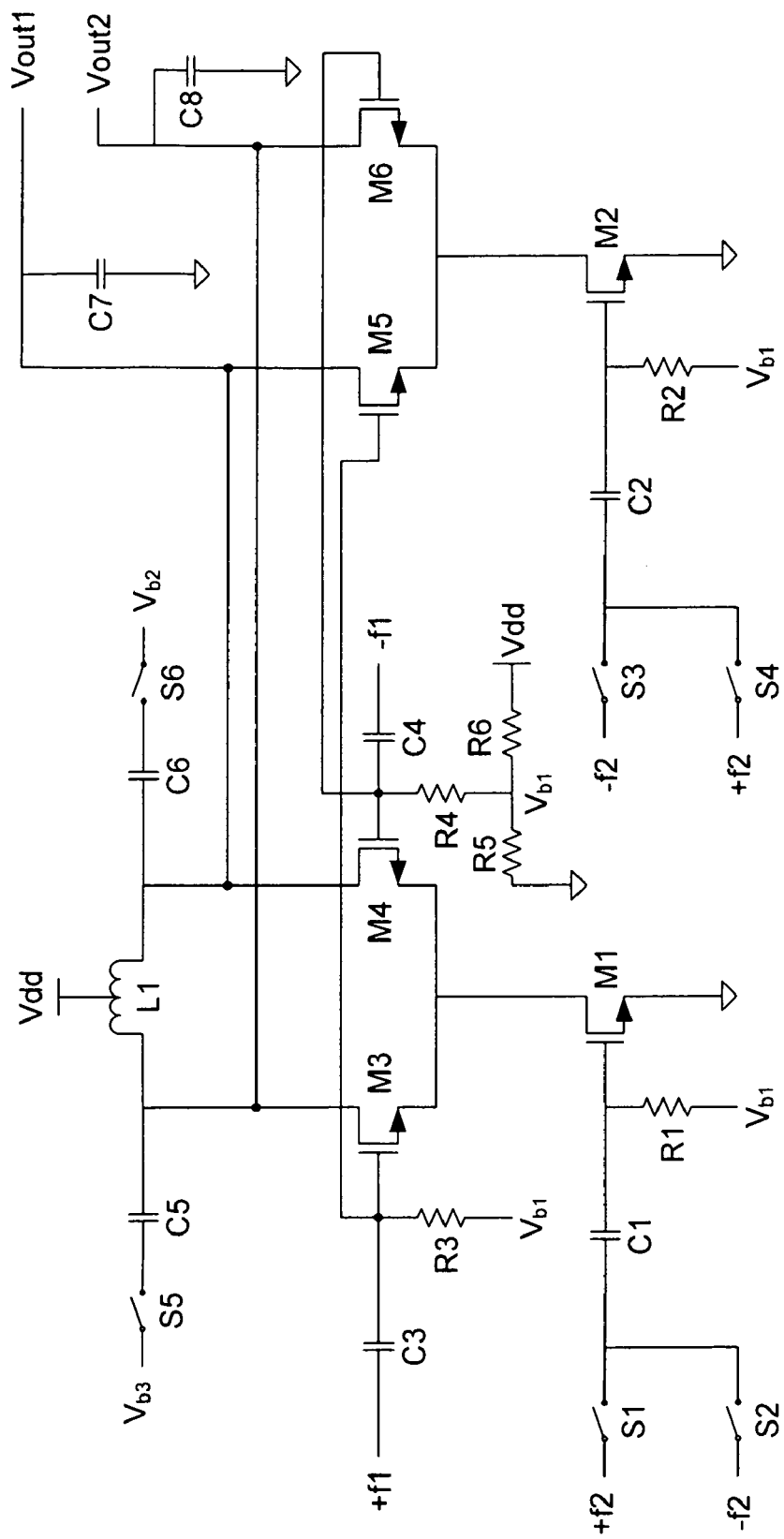
FIG. 10A is a detailed circuit diagram of a mixer that may be used in embodiments of the present invention.

FIG. 10A is a detailed circuit diagram of a mixer that may be used in embodiments of the present invention. Mixer 1000A includes first and second differential pairs that receive complementary components of a first signal $f_1$ on the differential input and a second signal $f_2$ on a second input. In particular, complementary components $+/-f_1$ are coupled through capacitors C3 and C4 to the gate terminals of transistors M3/M5 and M4/M6, respectively. The gates terminals are biased through resistors R3 and R4 by a bias voltage, $V_{b1}$, which may be generated by a resistor divider comprising resistors R5 and R6 coupled between supply (Vdd) and ground, for example. The second input to mixer 1000A is received on the gate terminals of transistors M1 and M2, which are coupled between the source coupled nodes of M3/M4 and M5/M6 and ground, respectively. Switches S1-S4 couple complementary input signals $+/-f_2$ to the gates of M1 and M2 through capacitors C1 and C2. If switches S1 and S3 are closed, then $+f_2$ is coupled to the gate of M1 and $-f_2$ is coupled to the gate of M2. Alternatively if switches S2 and S4 are closed, then $-f_2$ is coupled to the gate of M1 and $+f_2$ is coupled to the gate of M2. The gates of transistors M1 and M2 are biased by bias voltage $V_{b1}$ through resistors R1 and R2, respectively.

The output of differential transistors M3/M4 and M5/M6 are coupled together to form outputs Vout1 and Vout2. In this example, the load on the output is an inductor network L1 coupled to supply Vdd. Closing switches S5 and S6 introduces capacitors C5 and C6 into the circuit to change the center frequency of the LC load (i.e., the tank). Embodiments of the present invention may use a mixer with resistive loading, a fixed tank, other switched tanks or a low Q tank as a load depending on circuit requirements. For example, synthesizer 700 of FIG. 7 may use a fixed tank for mixer 771, a resistive load for mixers 772 and 773, a switchable tank for mixer 774 and a low Q tank for mixer 775.

Figure 10B:
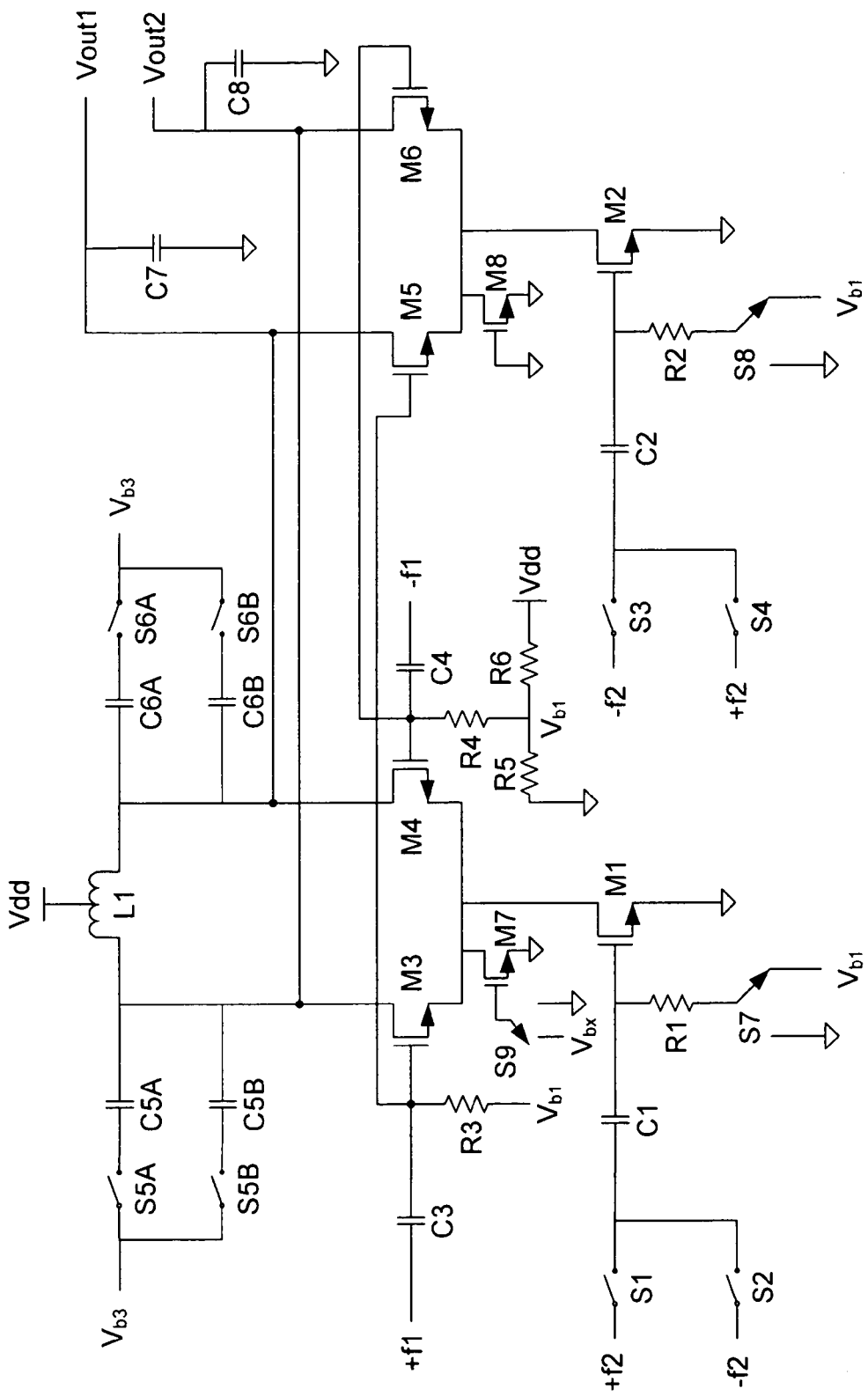
FIG. 10B is a detailed circuit diagram of another mixer that may be used in embodiments of the present invention.

FIG. 10B is a detailed circuit diagram of another mixer that may be used in embodiments of the present invention. In one state, mixer 1000B may be configured to be a subtracting (or difference) mixer. In another state, mixer 1000B is a buffer. In yet another state, mixer 1000B is a summing mixer. For example, when switches S2 and S4 are closed, mixer 1000B will subtract +/−f1 from +/−f2. The output signal will have a frequency that is lower than the frequencies produced when the mixer is configured as a buffer or summing mixer. Accordingly, switches S5A, S5B, S6A, and S6B are also closed to add capacitance to the output and thereby adjust the output resonant frequency to a lower frequency. Switches S7 and S8 are configured to couple the gates of transistors M1 and M2 to bias voltage Vb1, and switch S9 inactivates M7 (described below) by coupling the gate to ground.

Mixer 1000B may also be configured to buffer +/−f1. For example, when S1, S2, S3, and S4 are open and S7/S8 ground the gates of M1 and M2, the second inputs are effectively turned off. However, the differential pair comprising M3 and M4 may be turned on by coupling a bias voltage Vbx to the gate of M7, which generates a bias current for M3 and M4. In a buffered configuration, +/−f1 will be received at the inputs of M3 and M4 and output on Vout1 and Vout2. Since the frequency of f1 is less than the output frequency when the mixer is in a summing mode, and greater than the output frequency when the mixer is in a subtraction mode, switches S5A and S6A are closed and switches S5B and S6B are open. Thus, the load impedance is adjusted to have a resonant frequency that is higher than the resonant frequency when the circuit is in subtraction mode.

Mixer 1000B may also be configured to sum the frequencies of f1 and f2. For example, when S1 and S3 are closed, mixer 1000B will add +/−f1 from +/−f2. The output signal will have a frequency that is greater than the frequencies produced when the mixer is configured as a buffer or subtracting mixer. Accordingly, switches S5A, S5B, S6A, and S6B are all open to remove capacitance from the output and thereby adjust the output resonant frequency to a higher frequency. Switches S7 and S8 are configured to couple the gates of transistors M1 and M2 to bias voltage Vb1, and switch S9 inactivates M7.

Figure 10C:
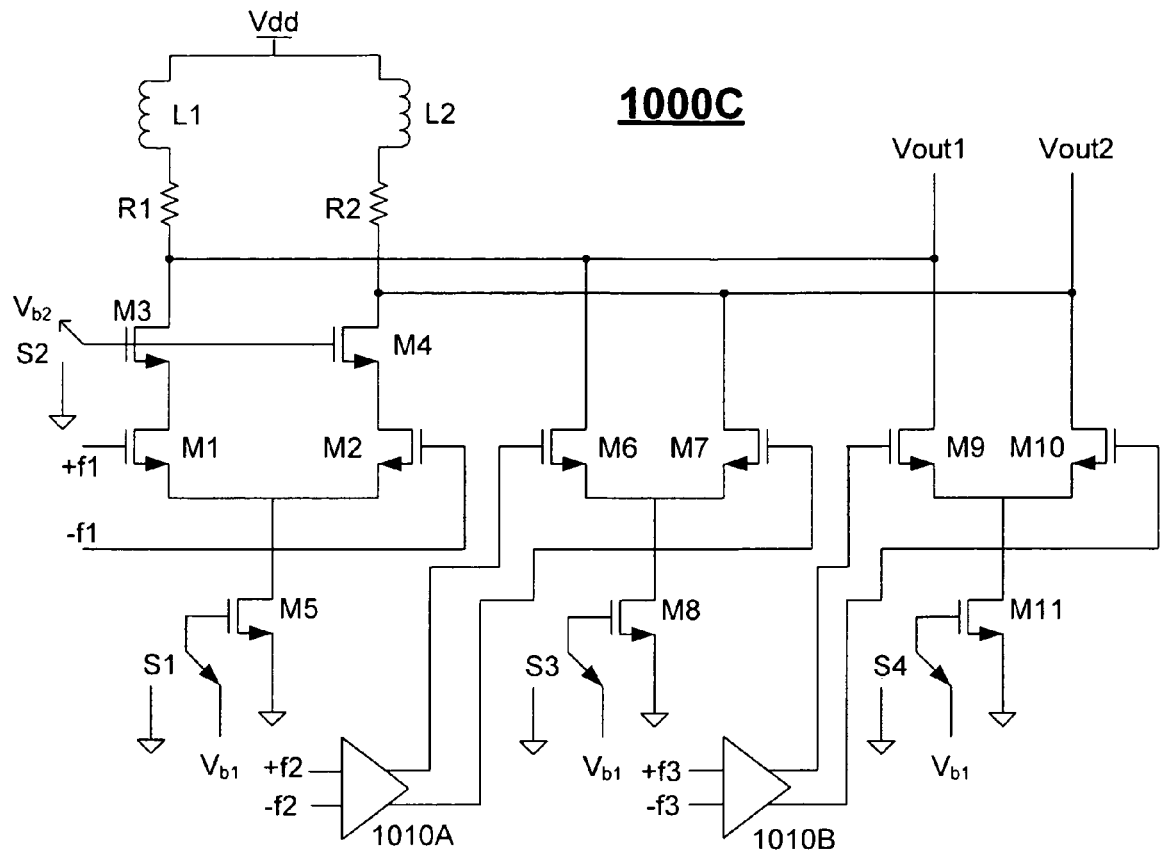
FIG. 10C is a detailed circuit diagram of a multiplexer that may be used in embodiments of the present invention.

FIG. 10C is a detailed circuit diagram of a multiplexer 1000C that may be used in embodiments of the present invention. Multiplexer 1000C includes a plurality of differential pairs M1/M2, M6/M7, and M9/M10 that may each be selectively disabled or enabled by switches S1, S3, and S4, for example. Each differential pair is coupled to a common load impedance. In this example, the common load impedance comprises resistors R1 and R2 coupled in series with inductors L1 and L2 between the common output terminals and supply Vdd. However, other loads may be used. A first signal +/−f1 may be received at the input of the first differential pair M1/M2. To couple f1 to the output, a switch may be used to activate bias current in differential pair M1/M2. In this example, switch S1 selectively couples a bias voltage Vb1 to the gate of M5 to activate or "turn on" a bias current in M1/M2. The bias current will activate M1 and M2, and the differential pair will pass the signal to the output. Similarly, switches S3 and S4 may be used to deactivate differential pairs M6/M7 and M9/M10 so that signals +/−f2 and +/−f3 are suppressed while f1 is active. In this example, cascode devices M3 and M4 may be used because +/−f1 correspond to the lower frequency signals $13f_b$, $15f_b$, and $17f_b$. M3 and M4 also introduce supplemental isolation when M5 is off. For instance, when M5 is off, the f1 signal can leak into the output through gate-drain capacitance of M1-M2, causing unwanted spurs. Therefore, cascade transistors may be turned off to isolate the input frequency from the output. In one embodiment, the cascode devices are biased into deep triode region using a 2.5v bias Vb2. However, because the cascode devices will limit the bandwidth of this stage of the multiplexer, they may not be useful for higher frequency stages.

Differential stages including M6/M7 and M9/M10 may include buffers 1010A and 1010B. Buffers 1010A and 1010B may be used to provide isolation of inputs signals f2 and f3 from the outputs. Input signal +/−f2 may be received by buffer 1010A, which may have outputs coupled to the inputs of M6 and M7. Input signal +/−f2 may be coupled to the output by coupling the gate of M8 to Vb1 through switch S3 while coupling the gates of M5 and M11 to ground through switches S1 and S4. Similarly, input signal +/−f3 may be received by buffer 1010B, which may have outputs coupled to the inputs of M9 and M10. Input signal +/−f3 may be coupled to the output by coupling the gate of M11 to Vb1 through switch S4 while coupling the gates of M5 and M8 to ground through switches S1 and S3.

Figure 10D:
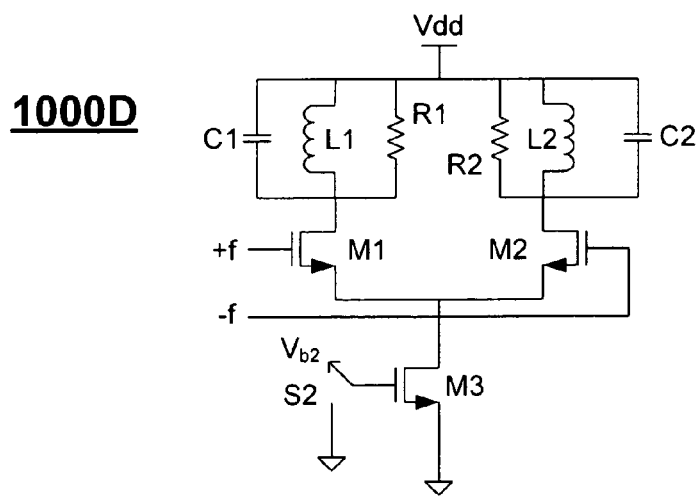
FIG. 10D is a detailed circuit diagram of a buffer that may be used in embodiments of the present invention.

FIG. 10D is a detailed circuit diagram of a buffer that may be used in embodiments of the present invention. Buffer 1000D may include a differential pair comprising M1 and M2 that receive a bias current from transistor M3. Buffer 1000D may include a load impedance comprising, for example, an LCR circuit include a capacitor, inductor, and resistor coupled between each output and supply. The values of the capacitors, inductors, and resistors may be tailored to buffer the particular frequencies that buffer 1000D will receive in the particular application. Buffer 1000D may also include a switch S2 that may be used to shut down the buffer when it is not being used. For example, in one embodiment, the multiplexer may activate a buffer coupled to a multiplexer input when the multiplexer input is selectively coupled to the output. In other words, when one of the differential pairs in the multiplexer is active, the buffer coupled to the input of that pair will be turned on. When one of the differential pairs in the multiplexer is inactive, the corresponding buffer may be deactivated ("turned off") to save power.

Figure 11A:
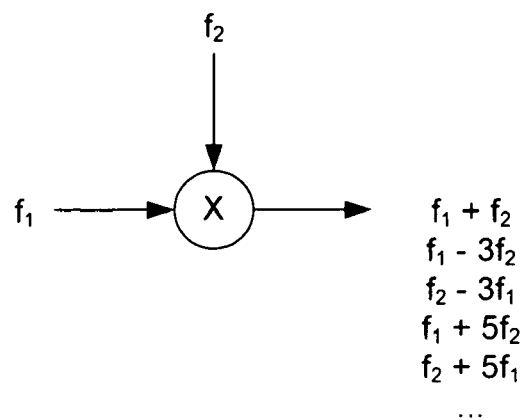
FIGS. 11A-B illustrate frequency content of mixers.
Figure 11B:
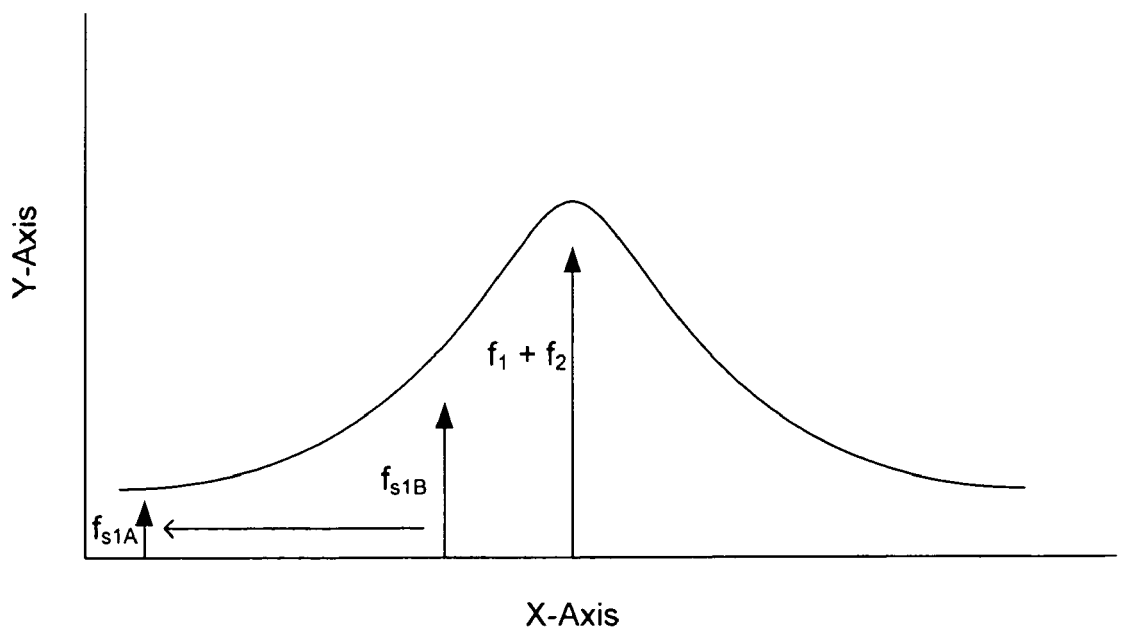

FIGS. 11A-B illustrate frequency content of mixers. FIG. 11A illustrates the frequency content at the output of a summing mixer receiving frequencies $f_1$ and $f_2$ on the mixer inputs. The primary frequency component (i.e., the fundamental) is the sum of the two input frequencies (i.e., $f_1+f_2$). However, a summing mixer also generates additional frequencies components (i.e., sidebands) at the absolute value of the following frequencies: $f_1-3f_2$, $f_2-3f_1$, $f_1+5f_2$, $f_2+5f_2$, etc . . . In one embodiment of the present invention, the frequencies used as inputs to the mixers are maximally separated in frequency so that the frequencies of the sidebands are far away from the frequency of the fundamental mixer output frequency. One advantage of this technique is illustrated in FIG. 11B. FIG. 11B illustrates a fundamental mixer output frequency $f_1+f_2$. It is often desirable to include filter circuits in the synthesizer (e.g., in the mixer) that pass the fundamental but attenuate the sidebands. By selecting maximally separated input frequencies for the mixer from the available frequencies to generate the desired fundamental mixer output frequency, the sidebands are moved farther away in frequency from the fundamental and the sidebands are more easily attenuated (or equivalently, lower Q filters may be used). For example, in FIG. 11B sideband frequency $f_{s1B}$ may be moved farther away from the fundamental to $f_{s1A}$ by selecting different input frequencies for the mixer from the available input frequencies.

For example, if the desired output frequency of a mixer is $f_o=15f_b$ (i.e., the desired output is fifteen (15) times some base frequency) and the following four (4) frequencies are available in the system [$f_1=3f_b$, $f_2=7f_b$, $f_3=8f_b$, $f_4=12f_b$], then the desired output may be achieved either by adding $f_2$ and $f_3$ (i.e., $7f_b+8f_b=15f_b$) or $f_1$ and $f_4$ (i.e., $3f_b+12f_b=15f_b$). The sidebands generated by adding $f_1$ and $f_4$ are as follows:

$$f_{s1A}=f_1-3f_4=|3f_b-3(12f_b)|=33f_b$$

$$f_{s1A}=f_4-3f_1=12f_b-3(3f_b)=3f_b$$

$$f_{s1A}=f_1+5f_4=3f_b+5(12f_b)=63f_b$$

$$f_{s1A}=f_4+5f_1=12f_b+5(3f_b)=27f_b$$

However, the sidebands generated by adding $f_2$ and $f_3$ are as follows:

$$f_{s1B}=f_2-3f_3=|7f_b-3(8f_b)|=17f_b$$

$$f_{s1B}=f_3-3f_2=|8f_b-3(7f_b)|=13f_b$$

$$f_{s1B}=f_2+5f_3=7f_b+5(8f_b)=47f_b$$

$$f_{s1B}=f_3+5f_2=8f_b+5(7f_b)=42f_b$$

Thus, the closest sideband to the desired fundamental (i.e., $15f_b$) is $f_{s1A}=27f_b$ when $f_1$ and $f_4$ are used as mixer inputs, which is $12f_b$ away from the fundamental (i.e., $27f_b-15f_b=12f_b$). On the other hand, the closest sideband to desired fundamental (i.e., $15f_b$) is $f_{s1B}=13f_b$ when $f_2$ and $f_3$ are used as mixer inputs, which is only $2f_b$ away from the fundamental (i.e., $15f_b-13f_b=2f_b$). Consequently, a higher Q filter would be required to pass the fundamental and attenuate the sideband if $f_2$ and $f_3$ are used as mixer inputs than if $f_1$ and $f_4$ are used as mixer inputs.

Figure 12:
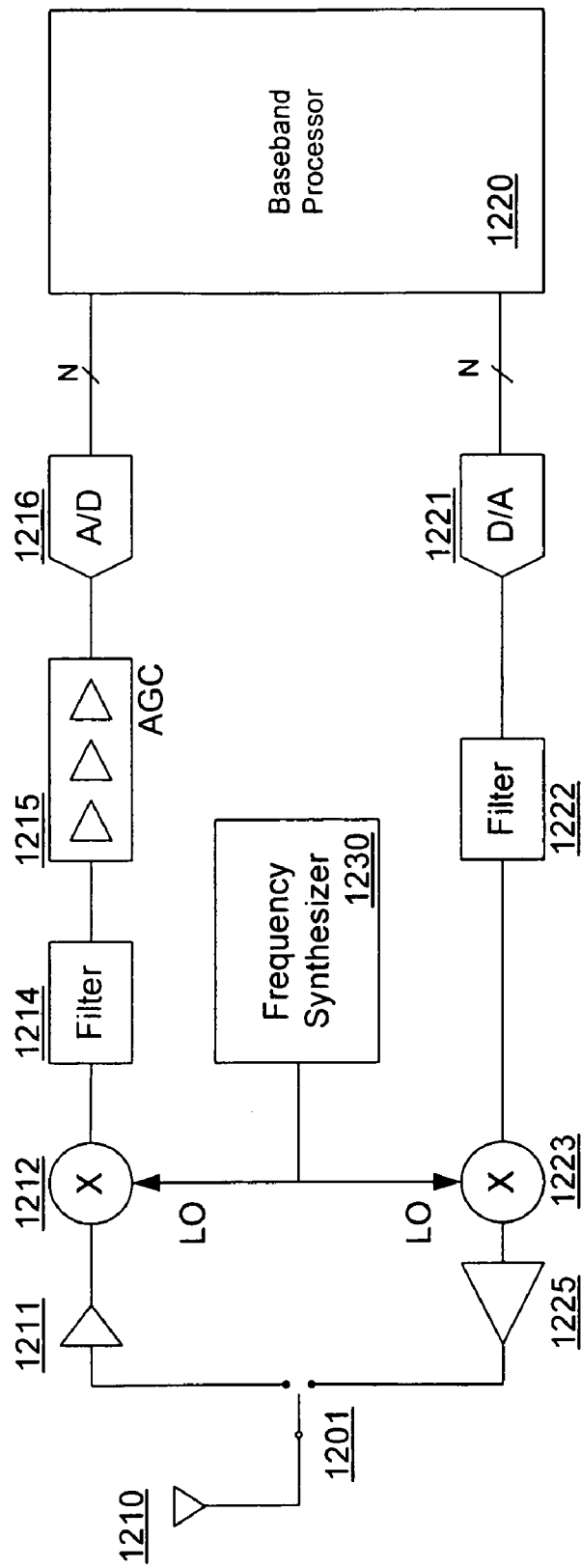
FIG. 12 illustrates a wireless system that may use frequency synthesizer circuits and methods of the present invention.

FIG. 12 illustrates a wireless system that may use frequency synthesizer circuits and methods of the present invention. FIG. 12 is an example of a direct conversion architecture that may use embodiments of the present invention. Wireless system 1200 includes antenna 1210 coupled through a switch 1201 to both a reception channel and a transmission channel. The reception channel includes a low noise amplifier 1211 ("LNA"), mixer 1212, frequency synthesizer 1230, filter 1214, automatic gain control 1215 ("AGC") and analog-to-digital converter 1216 ("A/D"). LNA 1211 is used for amplifying high frequency signals from antenna 1210 and must have sufficient bandwidth, gain and noise performance to meet system requirements. The reception channel may include two mixers and parallel paths thereafter for both in phase and quadrature paths (only one path is shown). Mixer 1212 receives a local oscillator signal ("LO") from frequency synthesizer 1230 at the carrier frequency and demodulates the RF input signal from the LNA 1211. In a direct conversion system, the input signal is demodulated down to baseband, and no intermediate frequencies are used. It is to be understood that embodiments of the present invention may be used in either a direct conversion system or a system using intermediate frequencies. Filter 1214 is used to extract the signal of interest from the demodulated signal, and AGC 1215 provides appropriate gain so that the input to A/D 1216 is as close as possible to the A/D's full range. The output of the reception channel is coupled to baseband processor 1220 over N-bit digital signal lines, for example, for decoding and further processing.

During transmission, baseband processor 1220 encodes a voice or data signal. The encoded signal is received by digital-to-analog converter 1221 ("D/A") as an N-bit digital signal, for example, and is converted into an analog signal. The output of D/A 1221 is passed through filter 1222 and mixer 1223. Mixer 1223 receives a local oscillator signal ("LO") from frequency synthesizer 1230 at the carrier frequency, and the input to the mixer is modulated by LO to produce a modulated output signal. The system may include two transmission paths for both in-phase and quadrature signals (not shown). The modulated mixer output signal is received by power amplifier 1225, which amplifies the power in the signal to drive antenna 1210.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A frequency synthesizer comprising:
   a phase detector having a first input that receives a reference signal having a reference frequency and a second input that receives a feedback signal;
   a charge pump coupled to the phase detector;
   a filter coupled to the charge pump;
   a voltage controlled oscillator coupled to the filter;
   a first plurality of dividers coupled to an output of the voltage controlled oscillator that generate a first plurality of divided signals, wherein the first plurality of dividers are divide-by-two circuits coupled in series;
   a digital divider coupled between the first plurality of dividers and the second input of the phase detector;
   a first mixer having a first input coupled to an output of a first divider in the first plurality of dividers having a frequency of one-half a frequency of the voltage controlled oscillator, a second input coupled to an output of a second divider in the first plurality of dividers having a frequency of one-fourth the frequency of the voltage controlled oscillator, and an output for producing the sum of the first mixer input frequencies;
   a first divide-by-two circuit coupled to the output of the first mixer;
   a second divide-by-two circuit coupled to an output of the first divide-by-two circuit;
   a second mixer having a first input coupled to the output of the first mixer, a second input coupled to an output of the second divide-by-two circuit, and an output for producing the sum of the second mixer input frequencies;
   a third mixer having a first input coupled to a third divider in the first plurality of dividers having a frequency of one-eighth the frequency of the voltage controlled oscillator, a second input coupled to the output of the second mixer, a control terminal for configuring the third mixer to produce either the sum or difference of the input frequencies, and an output for producing the sum or difference of the third mixer input frequencies;
   a first intermediate multiplexer having a first input coupled to the output of the second mixer, a second input coupled to the output of the third mixer, and a first select line for selectively coupling the first or second inputs to a first intermediate multiplexer output;
   a fourth mixer having a first input coupled to the output of the first intermediate multiplexer, a second input coupled to the output of the first divide-by-two circuit, and an output for producing the sum of the forth mixer input frequencies;
   a second intermediate multiplexer having a first input coupled to the output of the first mixer, a second input coupled to the output of the first divide-by-two circuit, and a second select line for selectively coupling the first or second inputs to a second intermediate multiplexer output;

a fifth mixer having a first input coupled to the output of the forth mixer, a second input coupled to the output of the second intermediate multiplexer, and an output for producing the sum of the fifth mixer input frequencies; and a third multiplexer having a first input coupled to the output of the first intermediate multiplexer, a second input coupled to the output of the forth mixer, a third input coupled to the output of the fifth mixer, and a select line for selectively coupling the first, second or third inputs to a third multiplexer output.

2. The frequency synthesizer of claim 1 further comprising a plurality of buffers coupled to the output of each divider in the first plurality of dividers.

3. The frequency synthesizer of claim 1 wherein the one or more of the first plurality of dividers are analog dividers.

4. The frequency synthesizer of claim 1 wherein the voltage controlled oscillator generates complementary in-phase signals, and the first divider in the plurality of dividers receives the complementary in-phase signals and generates complementary in-phase and complementary quadrature output signals.

5. The frequency synthesizer of claim 1 wherein one or more of the plurality of mixers are balanced in-phase and quadrature mixers.

6. The frequency synthesizer of claim 1 wherein the frequency of the voltage controlled oscillator, one or more of the first plurality of divided signals, or one or more of the synthesized mixer output signals is above 1 gigahertz.

7. The frequency synthesizer of claim 1 wherein one of the synthesized mixer output signals is coupled to a mixer in a wireless system for modulating or demodulating a signal.

8. The frequency synthesizer of claim 1 wherein the frequencies of the synthesized mixer output signals include odd multiples of a base frequency, fb.

9. The frequency synthesizer of claim 8 wherein the frequencies of the synthesized mixer output signals at the third multiplexer output include 13fb, 15fb, 17fb, 19fb, 21fb, 23fb, 25fb, 27fb, 29fb, 31fb, 33fb and 35fb.

10. A frequency synthesizer comprising:
a phase detector having a first input that receives a reference signal having a reference frequency and a second input that receives a feedback signal;
a charge pump coupled to the phase detector;
a filter coupled to the charge pump;
a voltage controlled oscillator coupled to the filter;
a first plurality of dividers coupled to an output of the voltage controlled oscillator that generate a first plurality of divided signals, wherein the first plurality of dividers are divide-by-two circuits coupled in series;
a digital divider coupled between the first plurality of dividers and the second input of the phase detector;
a first mixer having a first input coupled to an output of a first divider in the first plurality of dividers having a frequency of one-half the frequency of the voltage controlled oscillator, a second input coupled to an output of a second divider in the first plurality of dividers having a frequency of one-eighth the frequency of the voltage controlled oscillator, and an output for producing the sum of the first mixer input frequencies;
a divide-by-six circuit coupled to the output of the first divider in the first plurality of dividers;
a second mixer having a first input coupled to the output of the first mixer, a second input coupled to an output of the divide-by-six circuit, a control terminal for configuring the second mixer to produce either the sum or difference of the input frequencies, and an output for producing the sum or difference of the second mixer input frequencies;

a first intermediate multiplexer having a first input coupled to the output of the first mixer, a second input coupled to the output of the second mixer, and a first select line for selectively coupling the first or second inputs to a first intermediate multiplexer output;

a third mixer having a first input coupled to the output of the first intermediate multiplexer, a second input coupled to an output of a third divider in the first plurality of dividers having a frequency of one fourth the frequency of the voltage controlled oscillator, and an output for producing the sum of the third mixer input frequencies;

a second intermediate multiplexer having a first input coupled to the output of the first divider in the first plurality of dividers, a second input coupled to the output of the third divider in the first plurality of dividers, and a second select line for selectively coupling the first or second inputs to a second intermediate multiplexer output;

a forth mixer having a first input coupled to the output of the third mixer, a second input coupled to the output of the second intermediate multiplexer, and an output for producing the sum of the forth mixer input frequencies; and a third multiplexer having a first input coupled to the output of the first intermediate multiplexer, a second input coupled to the output of the third mixer, a third input coupled to the output of the forth mixer, and a select line for selectively coupling the first, second or third inputs to a third multiplexer output.

11. The frequency synthesizer of claim 10 further comprising a plurality of buffers coupled to the output of each divider in the first plurality of dividers.

12. The frequency synthesizer of claim 10 wherein the one or more of the first plurality of dividers are analog dividers.

13. The frequency synthesizer of claim 10 wherein the voltage controlled oscillator generates complementary in-phase signals, and the first divider in the plurality of dividers receives the complementary in-phase signals and generates complementary in-phase and complementary quadrature output signals.

14. The frequency synthesizer of claim 10 wherein one or more of the plurality of mixers are balanced in-phase and quadrature mixers.

15. The frequency synthesizer of claim 10 wherein the frequency of the voltage controlled oscillator, one or more of the first plurality of divided signals, or one or more of the synthesized mixer output signals is above 1 gigahertz.

16. The frequency synthesizer of claim 10 wherein one of the synthesized mixer output signals is coupled to a mixer in a wireless system for modulating or demodulating a signal.

17. The frequency synthesizer of claim 10 wherein the frequencies of the synthesized mixer output signals include odd multiples of a base frequency, fb.

18. The frequency synthesizer of claim 17 wherein the frequencies of the synthesized mixer output signals at the third multiplexer output include 13fb, 15fb, 17fb, 19fb, 21fb, 23fb, 25fb, 27fb, 29fb, 31fb, 33fb and 35fb.

19. A frequency synthesis method comprising:
generating a voltage controlled oscillator signal in a phase locked loop, the phase locked loop comprising a phase detector, a charge pump, and a voltage controlled oscillator, the voltage controlled oscillator signal having a first frequency;

generating a plurality of divided signals from the voltage controlled oscillator signal, wherein the plurality of divided signals are generated using a plurality of divider circuits coupled in series;

mixing a first signal at an output of a first divider circuit in the plurality of divider circuits with a second signal at an output of a second divider circuit in the plurality of divider circuits to produce a third signal, wherein the first signal has a frequency one-half the frequency of the voltage controlled oscillator signal, the second signal has a frequency one-fourth the frequency of the voltage controlled oscillator signal, and the third signal has a frequency equal to the sum of the first and second signal frequencies;

dividing the third signal frequency using first divide-by-two circuit coupled to receive the third signal and a second divide-by-two circuit coupled in series with the first divide-by-two circuit to produce a fourth signal at the output of the second divide-by-two circuit;

mixing the third and fourth signal to produce a fifth signal having a frequency equal to the sum of the third and fourth signal frequencies;

selectively mixing, in accordance with a control signal for configuring said mixing to produce either a sum or difference of input frequencies, a sixth signal at an output of a third divider circuit in the plurality of divider circuits with said fifth signal, wherein the sixth signal has a frequency one-eighth of the frequency of the voltage controlled oscillator signal to produce a seventh signal equal to the sum or difference of the fifth and sixth signals;

selectively coupling the fifth signal or the seventh signal to an output of a first intermediate multiplexer;

mixing an eighth signal at an output of said first divide-by-two circuit with the fifth or seventh signals at the output of the first intermediate multiplexer to produce a ninth signal, the ninth signal equal to the sum of the eighth signal and the fifth or seventh signals;

selectively coupling the third signal or the eighth signal to an output of a second intermediate multiplexer;

mixing the ninth signal with the third or eighth signal at the output of the second intermediate multiplexer to produce a tenth signal, wherein the tenth signal has a frequency equal to the sum of the ninth and third signals or the ninth and eighth signals; and selectively coupling the fifth or seventh signal at the output of the first intermediate multiplexer, the ninth signal, or the tenth signal to an output of a third multiplexer.

20. The method of claim 19 further comprising turning off at least one of the plurality of mixers when the at least one mixer is not coupled to the output of the third multiplexer and turning on the at least one of the plurality of mixers when the at least one mixer is coupled to the output of the third multiplexer.

21. The method of claim 19 wherein the plurality of divided signals are generated in a feedback path of the phase locked loop.

22. The method of claim 19 wherein the frequency of the voltage controlled oscillator signal, one or more of the plurality of divided signals, or one or more of the plurality of synthesized mixer output signals is above 1 gigahertz.

23. The method of claim 19 further comprising combining one of the plurality of synthesized mixer output signals with a signal in a wireless system for modulating or demodulating the signal.

24. The method of claim 19 wherein the frequencies of the synthesized mixer output signals include odd multiples of a base frequency, fb.

25. The method of claim 24 wherein the frequencies of the synthesized mixer output signals at the output of the third multiplexer output include 13fb, 15fb, 17fb, 19fb, 21fb, 23fb, 25fb, 27fb, 29fb, 31fb, 33fb and 35fb.

26. A frequency synthesis method comprising:

generating a voltage controlled oscillator signal in a phase locked loop, the phase locked loop comprising a phase detector, a charge pump, and a voltage controlled oscillator, the voltage controlled oscillator signal having a first frequency;

generating a plurality of divided signals from the voltage controlled oscillator signal, wherein the plurality of divided signals are generated using a plurality of divider circuits coupled in series;

mixing a first signal at an output of a first divider circuit in the plurality of divider circuits with a second signal at an output of a second divider circuit in the plurality of divider circuits to produce a third signal, wherein the first signal has a frequency one-half the frequency of the voltage controlled oscillator signal, the second signal has a frequency one-eighth the frequency of the voltage controlled oscillator signal, and the third signal has a frequency equal to the sum of the first and second signal frequencies;

dividing the first signal frequency by a factor of six to produce a fourth signal;

selectively mixing, in accordance with a control signal for configuring said mixing to produce either a sum or difference of input frequencies, the third signal with the fourth signal to produce a fifth signal having a frequency equal to the sum or difference of the third and fourth signals;

selectively coupling the third signal or the fifth signal to an output of a first intermediate multiplexer;

mixing a sixth signal at an output of a third divider circuit in the plurality of divider circuits with the third or fifth signals at the output of the first intermediate multiplexer to produce a seventh signal, wherein the sixth signal has a frequency one-fourth the frequency of the voltage controlled oscillator signal, and wherein the seventh signal is equal to the sum of the sixth signal and the third or fifth signals;

selectively coupling the first signal or the sixth signal to an output of a second intermediate multiplexer;

mixing the seventh signal with the first or sixth signals at the output of the second intermediate multiplexer to produce an eighth signal, wherein the eighth signal has a frequency equal to the sum of the seventh and first signals or the seventh and sixth signals; and selectively coupling the third or fifth signals at the output of the first intermediate multiplexer, the seventh signal, or the eighth signal to an output of a third multiplexer.

27. The method of claim 26 further comprising turning off at least one of the plurality of mixers when the at least one mixer is not coupled to the output of the third multiplexer and turning on the at least one of the plurality of mixers when the at least one mixer is coupled to the output of the third multiplexer.

28. The method of claim 26 wherein the plurality of divided signals are generated in a feedback path of the phase locked loop.

29. The method of claim 26 further comprising combining one of the plurality of synthesized mixer output signals with a signal in a wireless system for modulating or demodulating the signal.

30. The method of claim 26 wherein the frequency of the voltage controlled oscillator signal, one or more of the plurality of divided signals, or one or more of the synthesized mixer output signals is above 1 gigahertz.

31. The method of claim 26 wherein the frequencies of the synthesized mixer output signals include odd multiples of a base frequency, fb.

32. The method of claim 31 wherein the frequencies of the synthesized mixer output signals at the output of the third multiplexer output include 13fb, 15fb, 17fb, 19fb, 21fb, 23fb, 25fb, 27fb, 29fb, 31fb, 33fb and 35fb.

* * * * *